US011901185B2

(12) United States Patent
Sano et al.

(10) Patent No.: US 11,901,185 B2
(45) Date of Patent: Feb. 13, 2024

(54) ETCHING METHOD

(71) Applicant: KABUSHIKI KAISHA TOSHIBA, Tokyo (JP)

(72) Inventors: Mitsuo Sano, Kamakura (JP); Susumu Obata, Yokohama (JP); Kazuhito Higuchi, Yokohama (JP); Takayuki Tajima, Sagamihara (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 220 days.

(21) Appl. No.: 17/473,418

(22) Filed: Sep. 13, 2021

(65) Prior Publication Data

US 2022/0301877 A1 Sep. 22, 2022

(30) Foreign Application Priority Data

Mar. 18, 2021 (JP) ................. 2021-044887

(51) Int. Cl.
*H01L 21/306* (2006.01)
*H01L 21/308* (2006.01)
*H01L 29/423* (2006.01)
*H01L 29/40* (2006.01)
*H01L 21/28* (2006.01)

(52) U.S. Cl.
CPC .. *H01L 21/30608* (2013.01); *H01L 21/28035* (2013.01); *H01L 21/3086* (2013.01); *H01L 29/401* (2013.01); *H01L 29/4236* (2013.01)

(58) Field of Classification Search
None
See application file for complete search history.

(56) References Cited

U.S. PATENT DOCUMENTS

| 6,265,075 B1 * | 7/2001 | Klueppel ............... H05K 3/184 428/209 |
| 10,838,298 B2 | 11/2020 | Singh |
| 10,854,466 B2 | 12/2020 | Matsuo et al. |
| 2008/0032242 A1 | 2/2008 | Masuda et al. |
| 2008/0090074 A1 | 4/2008 | Matsumura et al. |
| 2011/0266521 A1 | 11/2011 | Ferrari et al. |

(Continued)

FOREIGN PATENT DOCUMENTS

| JP | 8-82703 A | 3/1996 |
| JP | 9-321042 A | 12/1997 |

(Continued)

*Primary Examiner* — Alexander G Ghyka
(74) *Attorney, Agent, or Firm* — Oblon, McClelland, Maier & Neustadt, L.L.P.

(57) ABSTRACT

According to an embodiment, an etching method includes forming a first layer on a substrate having a main surface including first and second regions adjacent to each other, the first layer including a portion covering the first region and having a plurality of openings or one or more openings defining a plurality of island-shaped portions, and the first layer further including a portion as a continuous layer covering the second region, forming a catalyst layer an a portion(s) of the main surface exposed in the openings by plating, forming a second layer to cover a portion of the catalyst layer adjacent to a boundary between the first and second regions and expose a portion of the catalyst layer spaced apart from the boundary, and etching the substrate in a presence of the catalyst layer and the second layer.

15 Claims, 14 Drawing Sheets

(56) References Cited

U.S. PATENT DOCUMENTS

| | | |
|---|---|---|
| 2015/0130028 A1 | 5/2015 | Asano et al. |
| 2017/0062230 A1* | 3/2017 | Matsuo ............. H01L 21/67086 |
| 2018/0033634 A1* | 2/2018 | Matsuo ................... B01J 23/42 |
| 2019/0252199 A1* | 8/2019 | Matsuo ............. H01L 21/30604 |
| 2020/0219656 A1 | 7/2020 | Higuchi et al. |
| 2020/0235200 A1 | 7/2020 | Obata et al. |
| 2021/0296432 A1* | 9/2021 | Sano ....................... H01L 28/91 |
| 2022/0115238 A1* | 4/2022 | Tajima ............. H01L 21/30604 |

FOREIGN PATENT DOCUMENTS

| | | |
|---|---|---|
| JP | 4376706 B2 | 12/2009 |
| JP | 2011-101009 A | 5/2011 |
| JP | 2013-527103 A | 6/2013 |
| JP | 2017-195383 A | 10/2017 |
| JP | 2017-201660 A | 11/2017 |
| JP | 2019-140225 A | 8/2019 |
| JP | WO 2019/171750 A1 | 9/2019 |
| JP | 2019-535133 A | 12/2019 |
| JP | 2020-119936 A | 8/2020 |
| WO | WO 2019/171470 A1 | 9/2019 |

\* cited by examiner

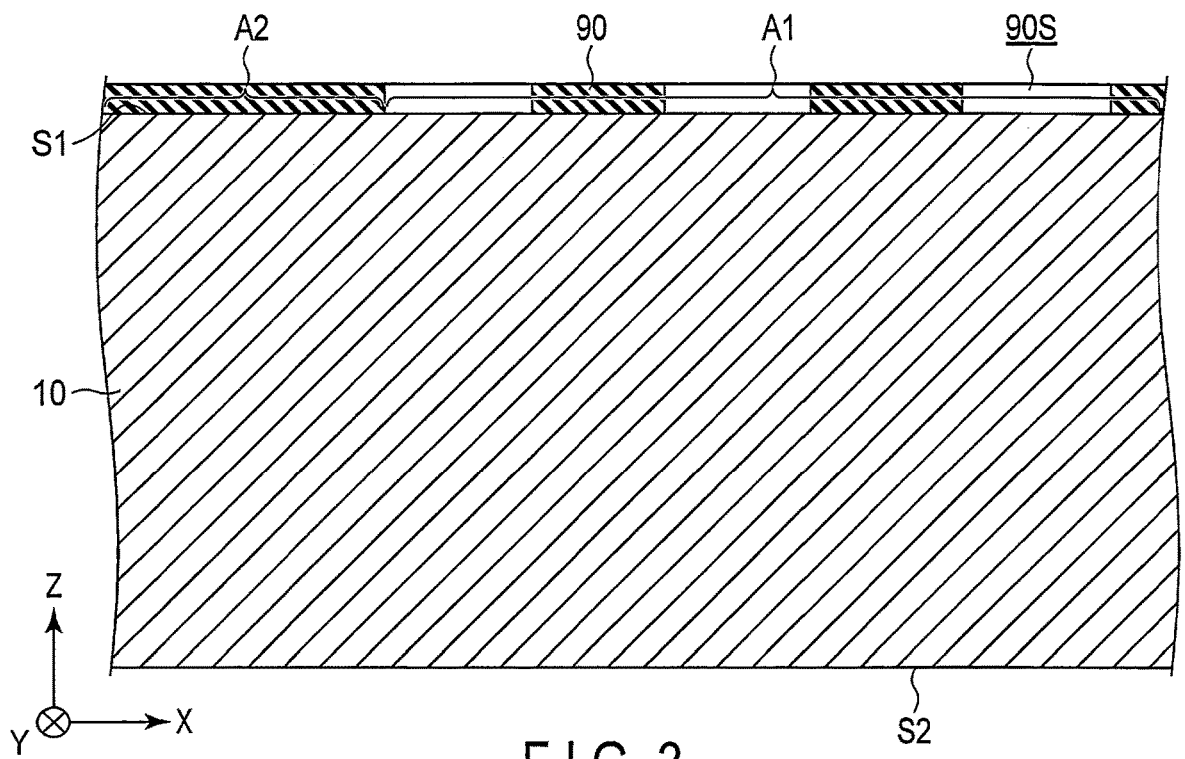
F I G. 3
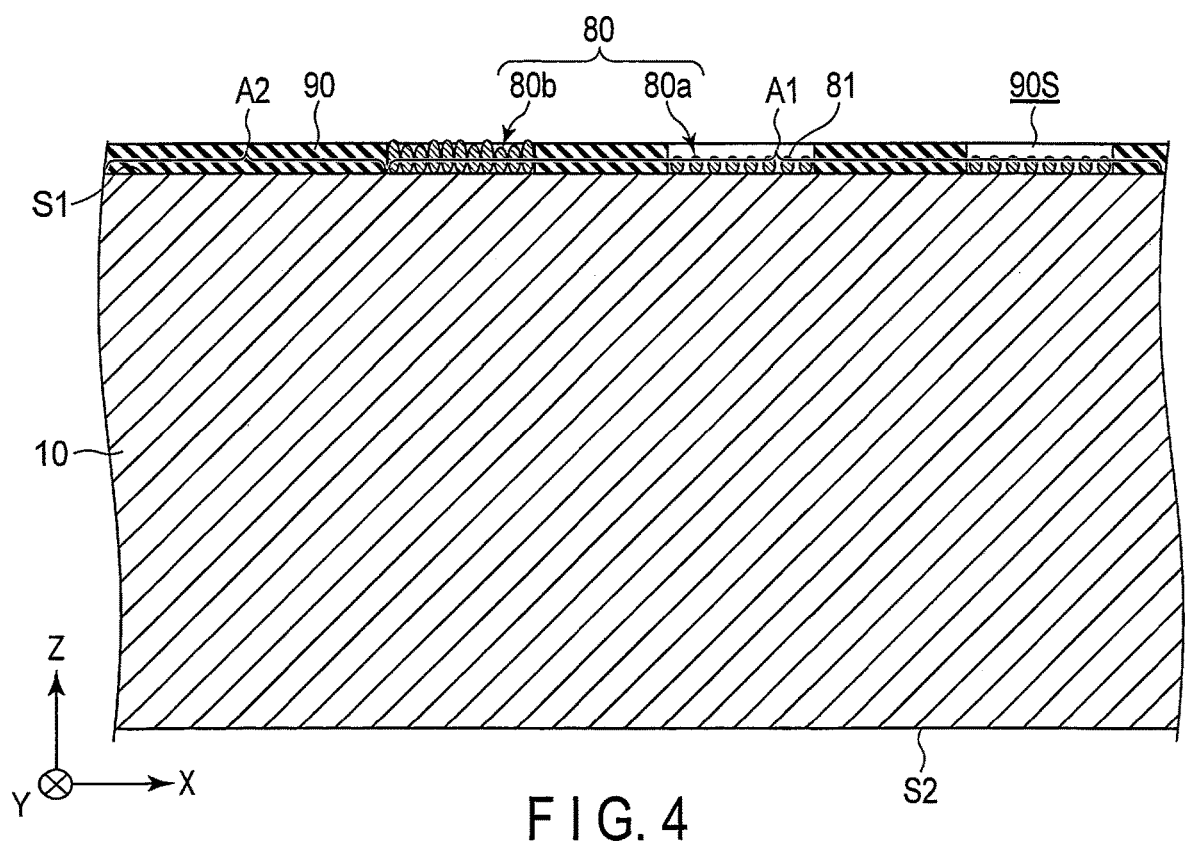
F I G. 4

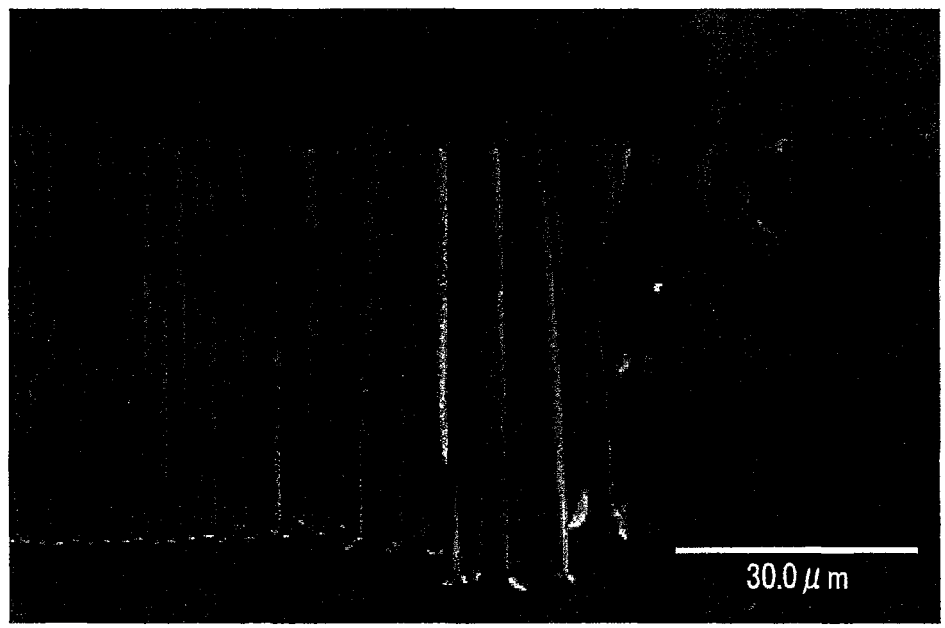
F I G. 12
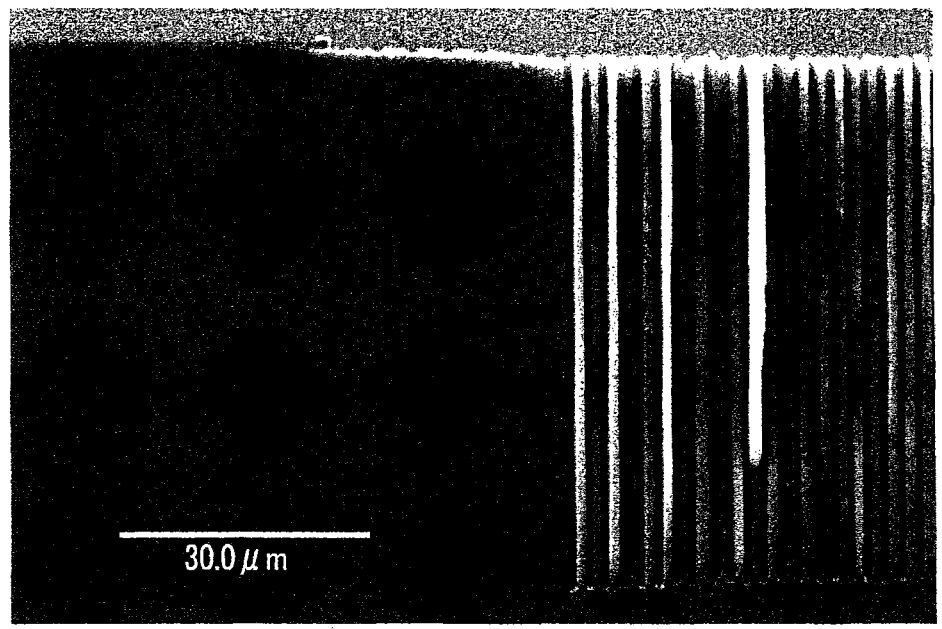
F I G. 13

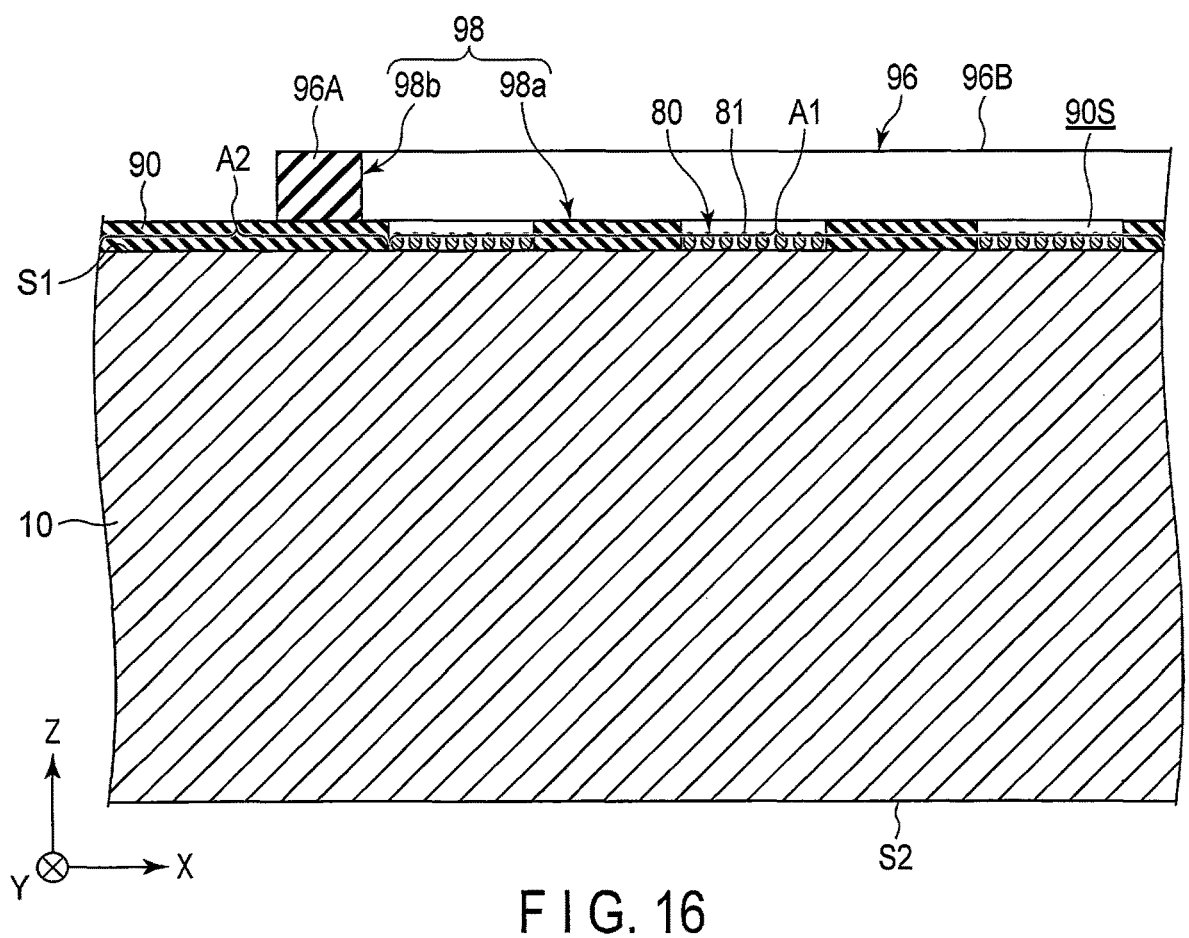
F I G. 16

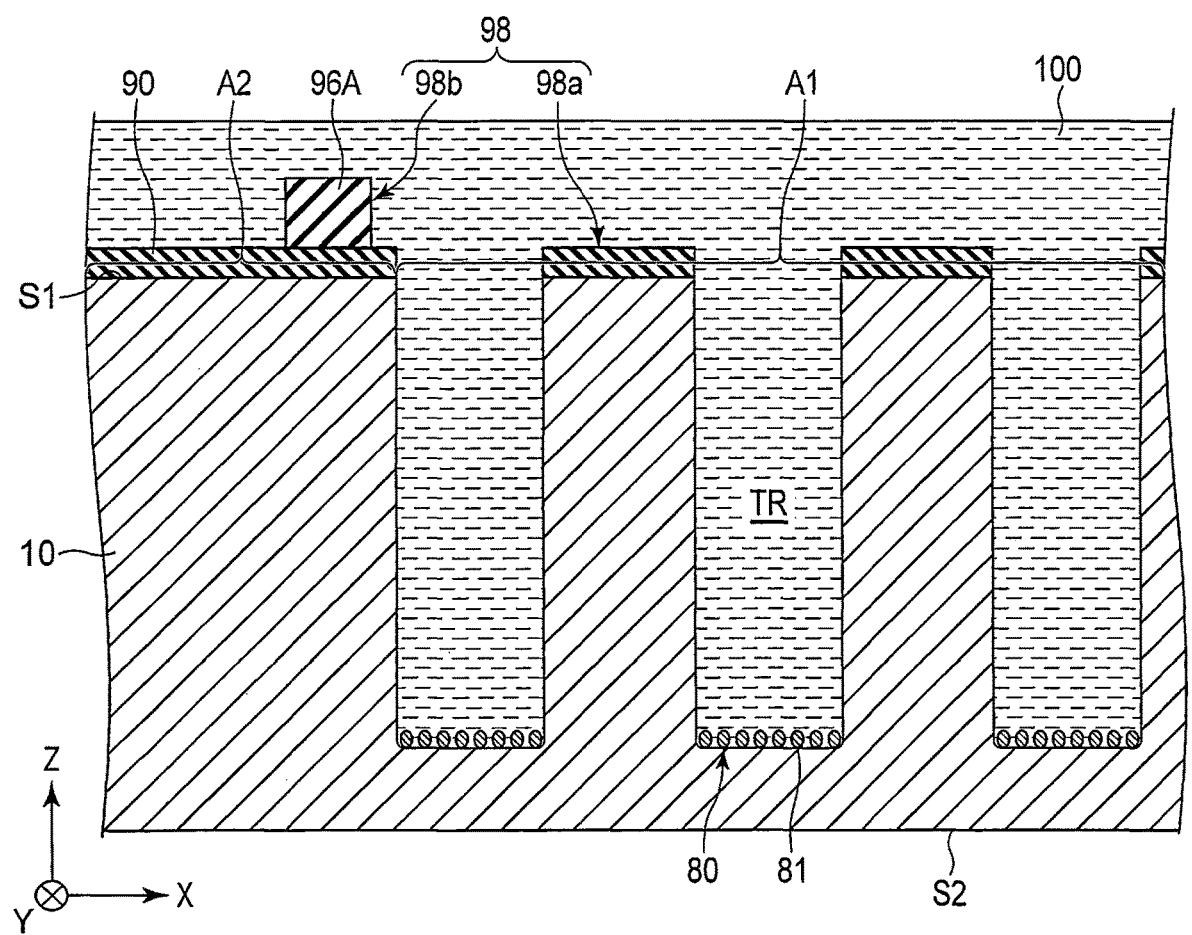
F I G. 17

ETCHING METHOD

CROSS-REFERENCE TO RELATED APPLICATIONS

This application is based upon and claims the benefit of priority from Japanese Patent Applications No. 2021-044887, filed Mar. 18, 2021, the entire contents of which are incorporated herein by reference.

FIELD

Embodiments described herein relate generally to an etching method.

BACKGROUND

Metal-assisted chemical etching (MacEtch) is a method of etching a semiconductor surface using a noble metal as a catalyst. According to MacEtch, for example, a recess with a high aspect ratio can be formed on a semiconductor substrate.

BRIEF DESCRIPTION OF THE DRAWINGS

FIG. 3 is a cross-sectional view showing a step of a capacitor manufacturing method according to the first embodiment;

FIG. 4 is a cross-sectional view showing another step of the capacitor manufacturing method according to the first embodiment;

FIG. 12 is an electron micrograph showing an example of a structure obtained when a second layer is omitted;

FIG. 13 is an electron micrograph showing an example of a structure obtained when a second layer is provided;

FIG. 16 is a cross-sectional view showing another step of the capacitor manufacturing method according to the second embodiment;

FIG. 17 is a cross-sectional view showing still another step of the capacitor manufacturing method according to the second embodiment.

DETAILED DESCRIPTION

Figure 1:
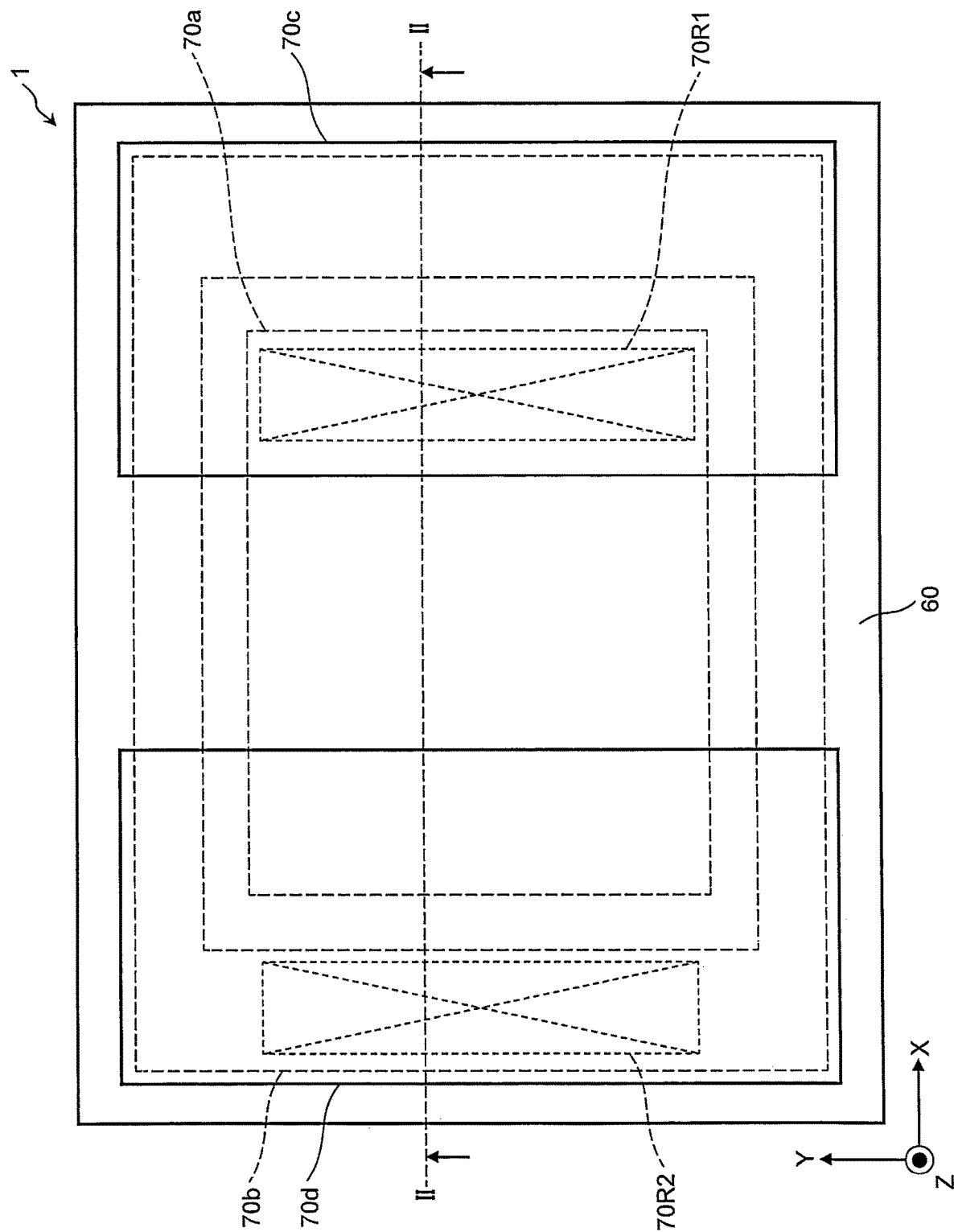
FIG. 1 is a top view showing an example of a capacitor that can be manufactured by a method according to first and second embodiments.

Embodiments will be described in detail below with reference to the accompanying drawings. Note that the same reference numerals denote constituent elements which achieve the same or similar functions throughout all the drawings, and repetitive explanations will be omitted.

First Embodiment

An etching method according to the first embodiment comprises forming a first layer on a substrate, the substrate containing a semiconductor material and having a main surface, the main surface including a first region and a second region adjacent to each other, the first layer covering the first region and the second region, a portion of the first layer covering the first region being provided with a plurality of openings or one or more openings defining a plurality of island-shaped portions, and a portion of the first layer covering the second region being a continuous layer; forming a catalyst layer containing a noble metal on a portion(s) of the main surfaces exposed in the plurality of openings or the one or more openings by a plating method; forming a second layer to cover a portion of the catalyst layer adjacent to a boundary between the first region and the second region and expose a portion of the catalyst layer spaced apart from the boundary; and etching the substrate with an etching agent containing an oxidizer and hydrogen fluoride in a presence of the catalyst layer and the second layer.

A method for manufacturing a structural body according to the first embodiment, comprises forming one or more recesses on the substrate by the above etching method.

A method for manufacturing a semiconductor device according to the first embodiment, comprises forming one or more recesses on the substrate by the above etching method; forming a lower electrode on side walls of the one or more recesses; forming a dielectric layer on the lower electrode; and forming an upper electrode on the dielectric layer.

A method for manufacturing a structural body, specifically a capacitor, which is an example of a semiconductor device, utilizing the above etching method is described below.

Figure 2:
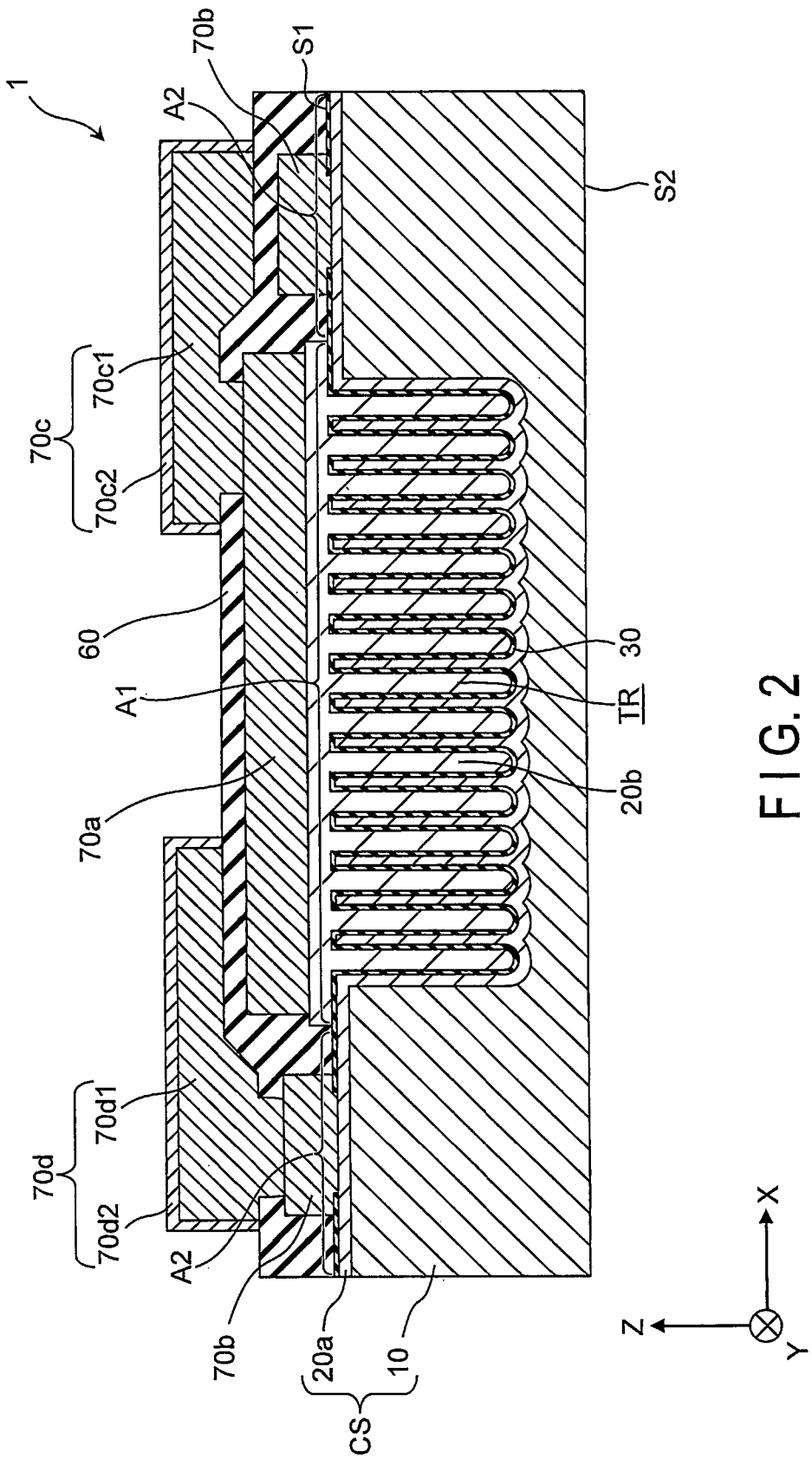
FIG. 2 is a cross-sectional view taken along a line II-II of the capacitor shown in FIG. 1.

FIGS. 1 and 2 show an example of a capacitor that can be manufactured by the method according to the first embodiment.

A capacitor 1 shown in FIGS. 1 and 2 includes a conductive substrate CS, a conductive layer 20b, and a dielectric layer 30, as shown in FIG. 2.

In each figure, an X direction is a direction parallel to a main surface of the conductive substrate CS, and a Y direction is a direction parallel to the main surface of the conductive substrate CS and perpendicular to the X direction. In addition, a Z direction is a thickness direction of the conductive substrate CS, i.e., a direction perpendicular to the X direction and the Y direction.

The conductive substrate CS includes a semiconductor material such as silicon. The conductive substrate CS is a substrate having electrical conductivity at least in its surface facing the conductive layer 20b. At least a portion of the conductive substrate CS serves as a lower electrode of the capacitor.

The conductive substrate CS has a first main surface S1, a second main surface S2, and an end face extending from an edge of the first main surface S1 to an edge of the second main surface S2. Here, the conductive substrate CS has a flat and approximately right-angled parallelepiped shape. The conductive substrate CS may have other shapes.

The first main surface S1, i.e., a top surface of the conductive substrate CS in this embodiment, includes a first region A1 and a second region A2. The first region A1 corresponds to a portion of the conductive substrate CS on which recesses TR described later are provided. The second region A2 is equal to the first region A1 in height. The second region A2 is adjacent to the first region A1.

Herein, the first region A1 has a rectangular shape, and the second region A2 surrounds the first region A1.

A portion that corresponds to the first region A1 of the conductive substrate CS is provided with a plurality of recesses TR, each having a shape extending in one direction and arranged in the width direction. The recesses TR are open in the first region A1. The recesses TR are spaced apart from one another. Herein, the recesses TR are trenches extending in the Y direction and arranged in the X direction.

Portions of the conductive substrate CS each sandwiched between one and the other of adjacent recesses TR are projections. The projections each have a shape extending in the Y direction and are arranged in the X direction. That is, the portion of the conductive substrate CS that corresponds to the first region A1 is provided with a plurality of wall parts each having a shape extending in the Y direction and the Z direction and arranged in the X direction as the projections.

The "length direction" of the recesses or the projections is a length direction of orthogonal projections of the recesses or the projections onto a plane perpendicular to the thickness direction of the conductive substrate.

A length of an opening of each recess TR is within a range of 10 μm to 500 μm according to an example, and within a range of 50 μm to 100 μm according to another example.

A width of the opening of the recess TR, i.e., a distance between the projections adjacent in the width direction, is preferably 0.3 μm or more. If this width or distance is reduced, a larger electric capacitance can be achieved. However, if this width or distance is reduced, it becomes difficult to form a stacked structure including the dielectric layer 30 and the conductive layer 20b in the recesses TR.

A depth of the recesses TR or a height of the projections is within a range of 10 μm to 300 μm according to an example, and within a range of 50 μm to 100 μm according to another example.

A distance between the recesses TR adjacent in the width direction, i.e., a thickness of the projection, is preferably 0.1 μm or more. If this distance or thickness is reduced, a larger electric capacitance can be achieved. However, if this distance or thickness is reduced, the projections are likely to be damaged.

Here, cross sections of the recesses TR perpendicular to the length directions are rectangular. However, these cross sections need not be rectangular and may have, for example, a tapered shape.

The conductive substrate CS includes a substrate 10 and a conductive layer 20a.

The substrate 10 has the same shape as that of the conductive substrate CS. The substrate 10 is a substrate containing a semiconductor material, for example, a semiconductor substrate. The substrate 10 is preferably a substrate containing silicon such as a silicon substrate. Such a substrate can be processed using semiconductor processes.

The conductive layer 20a is provided on the substrate 10. Here, the conductive layer 20a serves as a lower electrode of the capacitor. The conductive layer 20a is made of, for example, polysilicon doped with impurities to improve the electrical conductivity, or a metal such as molybdenum, aluminum, gold, tungsten, platinum, nickel, or copper, or an alloy thereof. The conductive layer 20a may have a single-layer structure or a multi-layer structure.

A thickness of the conductive layer 20a is preferably within a range of 0.05 μm to 1 μm, and more preferably within a range of 0.1 μm to 0.3 μm. If the conductive layer 20a is thin, the possibility exists that a discontinuous portion may be generated in the conductive layer 20a, or a sheet resistance of the conductive layer 20a may be excessively increased. When the conductive layer 20a is thickened, manufacturing costs increase.

Here, as an example, it is supposed that the substrate 10 is a semiconductor substrate such as a silicon substrate, and the conductive layer 20a is a high-concentration doped layer that is a surface region of the semiconductor substrate doped with impurities at a high concentration. In this case, the projections, if thin enough, can be entirely doped with impurities at a high concentration.

If the substrate 10 has a high electrical conductivity, the conductive layer 20a may be omitted, and the substrate 10 may be used as the conductive substrate CS. For example, if the substrate 10 is a semiconductor substrate made of a semiconductor doped with P-type or N-type impurities, or a metal substrate, the conductive layer 20a can be omitted. In this case, at least a surface region of the substrate 10, e.g., the entire substrate 10, serves as the conductive layer 20a.

The conductive layer 20b serves as an upper electrode of the capacitor. The conductive layer 20b is provided on the first region A1, and covers sidewalls and bottom surfaces of the recesses TR.

The conductive layer 20b is made of, for example, polysilicon doped with impurities to improve the electrical conductivity, or a metal such as molybdenum, aluminum, gold, tungsten, platinum, nickel, or copper, or an alloy thereof. The conductive layer 20b may have a single-layer structure or a multi-layer structure.

A thickness of the conductive layer 20b is preferably within a range of 0.05 μm to 1 μm, and more preferably within a range of 0.1 μm to 0.3 μm. If the conductive layer 20b is thin, the possibility exists that a discontinuous portion may be generated in the conductive layer 20b, or a sheet resistance of the conductive layer 20b may be excessively increased. If the conductive layer 20b is thick, it may be difficult to form the conductive layer 20a and the dielectric layer 30 with sufficient thicknesses.

In FIG. 2, the conductive layer 20b is provided so that the recesses TR are completely filled with the conductive layer 20b and the dielectric layer 30. The conductive layer 20b may be a layer that is conformal to a surface of the conductive substrate CS. That is, the conductive layer 20b may be a layer having an approximately uniform thickness. In this case, the recesses TR are not completely filled with the conductive layer 20b and the dielectric layer 30.

The dielectric layer 30 is interposed between the conductive substrate CS and the conductive layer 20b. The dielectric layer 30 is a layer that is conformal to the surface of the conductive substrate CS. The dielectric layer 30 electrically insulates the conductive substrate CS and the conductive layer 20b from each other.

The dielectric layer 30 is made of, for example, an organic dielectric or an inorganic dielectric. As the organic dielectric, for example, polyimide can be used. As the inorganic dielectric, a ferroelectric can be used. Paraelectrics such as silicon nitride, silicon oxide, silicon oxynitride, titanium oxide, and tantalum oxide, are preferable. These paraelectrics have a small change in dielectric constant with temperature. Therefore, when the paraelectrics are used for the dielectric layer 30, the heat resistance of the capacitor 1 can be improved.

A thickness of the dielectric layer 30 is preferably within a range of 0.005 µm to 0.5 µm, and more preferably within a range of 0.01 µm to 0.1 µm. When the dielectric layer 30 is thin, the possibility exists that a discontinuous portion may be generated in the dielectric layer 30, and the conductive substrate CS and the conductive layer 20b may be short-circuited. Further, if the dielectric layer 30 is thinned, a withstand voltage is lowered even if there is no short circuit, and a possibility of short-circuiting when a voltage is applied is increased. When the dielectric layer 30 is thickened, the withstand voltage increases, but the electric capacitance decreases.

A portion of the dielectric layer 30 located above the second region A2 is opened such that the opening surrounds the first region A1. That is, the dielectric layer 30 allows the conductive layer 20a to be exposed at this position. Here, the portion of the dielectric layer 30 that is provided on the first main surface S1 is opened in a frame shape.

This capacitor 1 further includes an insulating layer 60, a first internal electrode 70a, a second internal electrode 70b, a first external electrode 70c, and a second external electrode 70d.

The first internal electrode 70a is provided on the first region A1. The first internal electrode 70a is electrically connected to the conductive layer 20b. Here, the first internal electrode 70a is a rectangular electrode located at a center of the first main surface S1.

The second internal electrode 70b is provided on the second region A2. The second internal electrode 70b is in contact with the conductive substrate CS at a position of the opening provided in the dielectric layer 30. Thereby, the second internal electrode 70b is electrically connected to the conductive substrate CS. Here, the second internal electrode 70b is a frame-shaped electrode arranged to surround the first internal electrode 70a.

The first internal electrode 70a and the second internal electrode 70b may have a single-layer structure or a multi-layer structure. Each layer constituting the first internal electrode 70a and the second internal electrode 70b is made of, for example, a metal such as molybdenum, aluminum, gold, tungsten, platinum, copper, nickel, or an alloy containing one or more of them.

The insulating layer 60 covers portions of the conductive layer 20b and the dielectric layer 30 that are located on the first main surface S1, and further covers the first internal electrode 70a and the second internal electrode 70b. The insulating layer 60 is partially opened at a position of a part of the first internal electrode 70a and a position of a part of the second internal electrode 70b.

The insulating layer 60 may have a single-layer structure or a multi-layer structure. Each layer constituting the insulating layer 60 is made of, for example, an inorganic insulator such as silicon nitride and silicon oxide, or an organic insulator such as polyimide and novolac resin.

The first external electrode 70c is provided on the insulating layer 60. The first external electrode 70c is in contact with the first internal electrode 70a at a position of one or more openings provided in the insulating layer 60. Thereby, the first external electrode 70c is electrically connected to the first internal electrode 70a. In FIG. 1, a region 70R1 is a region where the first external electrode 70c and the first internal electrode 70a are in contact with each other.

The second external electrode 70d is provided on the insulating layer 60. The second external electrode 70d is in contact with the second internal electrode 70b at a position of the remaining opening(s) provided in the insulating layer 60. Thereby, the second external electrode 70d is electrically connected to the second internal electrode 70b. In FIG. 1, a region 70R2 is a region where the second external electrode 70d and the second internal electrode 70b are in contact with each other.

The first external electrode 70c has a stacked structure including a first metal layer 70c1 and a second metal layer 70c2. The second external electrode 70d has a stacked structure including a first metal layer 70d1 and a second metal layer 70d2.

The first metal layers 70c1 and 70d1 are made of, for example, copper. The second metal layers 70c2 and 70d2 cover upper and end surfaces of the first metal layers 70c1 and 70d1, respectively. The second metal layers 70c2 and 70d2 are constituted by, for example, a stacked film of a nickel or nickel alloy layer and a gold layer. The second metal layers 70c2 and 70d2 can be omitted.

The first external electrode 70c or the first internal electrode 70a may further include a barrier layer at a position adjacent to an interface therebetween. The second external electrode 70d or the second internal electrode 70b may further include a barrier layer at a position adjacent to an interface therebetween, too. As a material of the barrier layer, for example, titanium can be used.

This capacitor 1 is, for example, manufactured by the following method. Hereinafter, an example of a method of manufacturing the capacitor 1 will be described with reference to FIGS. 3 to 11.

In this method, the substrate 10 shown in FIG. 3 is first prepared. Here, as an example, the conductive layer 20a is formed by doping the surface region of the substrate 10 with impurities at a high concentration as will be described later. Accordingly, one main surface and the other main surface of the substrate 10 respectively correspond to the first main surface S1 and the second main surface S2 which have been explained with reference to FIG. 2.

The first main surface S1 includes the first region A1 and the second region A2 which have been explained with reference to FIG. 2.

Here, as an example, it is supposed that the substrate 10 is a single-crystal silicon wafer. A plane orientation of the single-crystal silicon wafer is not particularly limited, but in this embodiment, a silicon wafer whose first main surface S1 is a (100) plane is used. As the substrate 10, a silicon wafer whose first main surface S1 is a (110) plane can also be used.

Next, recesses are formed on the substrate 10 by MacEtch (Metal-Assisted Chemical Etching).

First, as shown in FIG. 3, a first layer 90 is formed on the first main surface S1 of the substrate 10.

In a portion of the first layer 90 that covers the first region A1, a plurality of openings are provided. Here, the openings are a plurality of slits 90S arranged in the width direction. The slits 90S have a length direction parallel to the Y direction, and are arranged in the X direction. A portion of the first layer 90 that covers the second region A2 is a continuous layer. The first layer 90 is a first mask layer that prevents the portions of the first main surface S1 that are covered with the first layer 90 from coming into contact with a noble metal, which will be described later.

The openings in the first layer 90 may have a form other than the slit. For example, as the openings, the first layer 90 may include a plurality of through holes each opened in a circular, elliptical, or polygonal shape and arranged in two directions intersecting each other.

Alternatively, the first layer 90 may be provided with one or more openings that define a plurality of island-shaped portions, instead of a plurality of openings. In this case, pillar-shaped projections can be generated at the positions corresponding to the island-shaped portions by etching, which will be described later.

Examples of the material of the first layer 90 include organic materials such as polyimide, fluororesin, phenol resin, acrylic resin, and novolac resin, and inorganic materials such as silicon oxide and silicon nitride.

The first layer 90 can be formed by, for example, existing semiconductor processes. The first layer 90 made of an organic material can be formed by, for example, photolithography. The first layer 90 made of an inorganic material can be formed by, for example, deposition of an inorganic material layer by vapor deposition, formation of a mask by photolithography, and patterning of the inorganic material layer by etching. Alternatively, the first layer 90 made of an inorganic material can be formed by oxidation or nitriding of the surface region of the substrate 10, formation of a mask by photolithography, and patterning of an oxide or nitride layer by etching.

Figure 5:
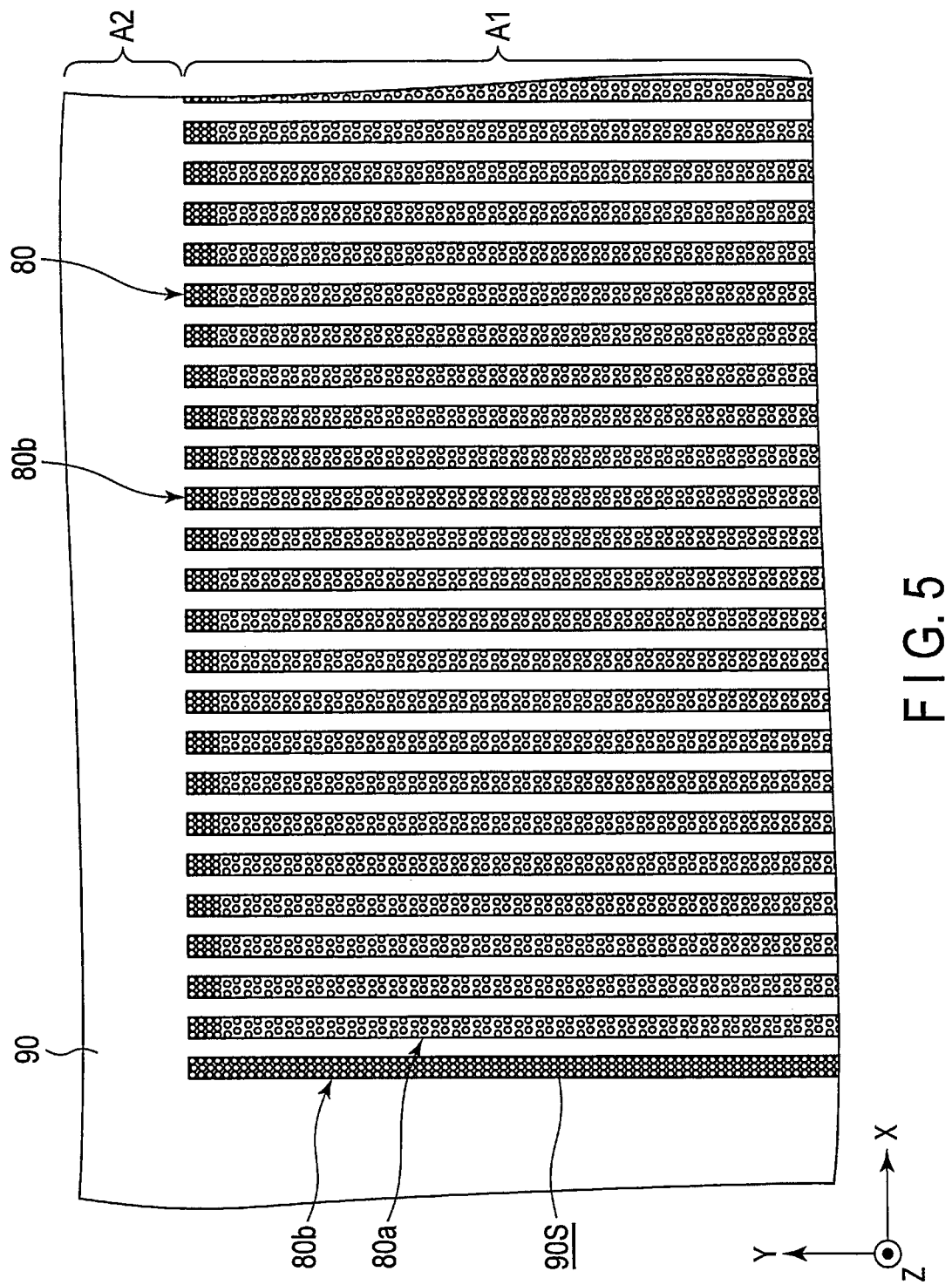
FIG. 5 is a top view showing a structure obtained by the step of FIG. 4.

Next, as shown in FIGS. 4 and 5, a catalyst layer 80 containing a noble metal is formed on portions of the first main surface S1 exposed in the slits 90S by a plating method.

The catalyst layer 80 is, for example, a discontinuous layer containing a noble metal. Here, as an example, it is supposed that the catalyst layer 80 is a particulate layer formed of catalyst particles 81 containing a noble metal.

The noble metal is, for example, one or more of gold, silver, platinum, rhodium, palladium, and ruthenium. The catalyst layer 80 and the catalyst particles 81 may further contain a metal other than a noble metal such as titanium.

The plating method used to form the catalyst layer 80 is, for example, electroplating, reduction plating, or displacement plating. Of these methods, displacement plating is particularly favorable because it is possible to directly and almost evenly deposit the noble metal on the regions of the first main surface S1 that are not covered with the first layer 90.

Whichever plating method is used, a region in the vicinity of a boundary between the first region A1 and the second region A2 differs from a region sufficiently spaced apart from the boundary in a balance between supply of a metal from a plating solution and consumption of the metal due to its deposition. Specifically, in the region in the vicinity of the boundary between the first region A1 and the second region A2, the metal deposits in the slit 90S more easily as compared to the region sufficiently spaced apart from the boundary. Therefore, the catalyst layer 80 comes to include a first catalyst portion 80a in which the metal deposits at a proper density and a second catalyst portion 80b in which the metal deposits at a high density. As will be described later, the second catalyst portion 80b is prone to generate a process defect.

Figure 6:
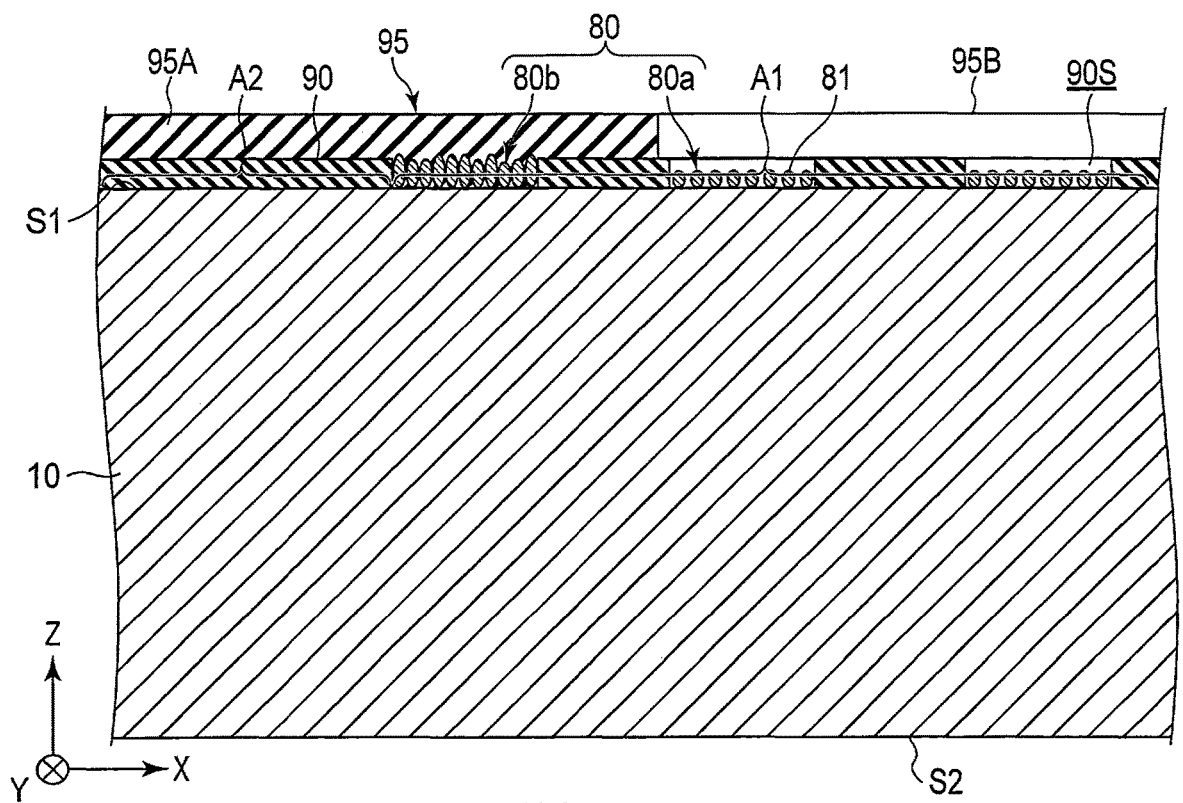
FIG. 6 is a cross-sectional view showing still another step of the capacitor manufacturing method according to the first embodiment.
Figure 7:
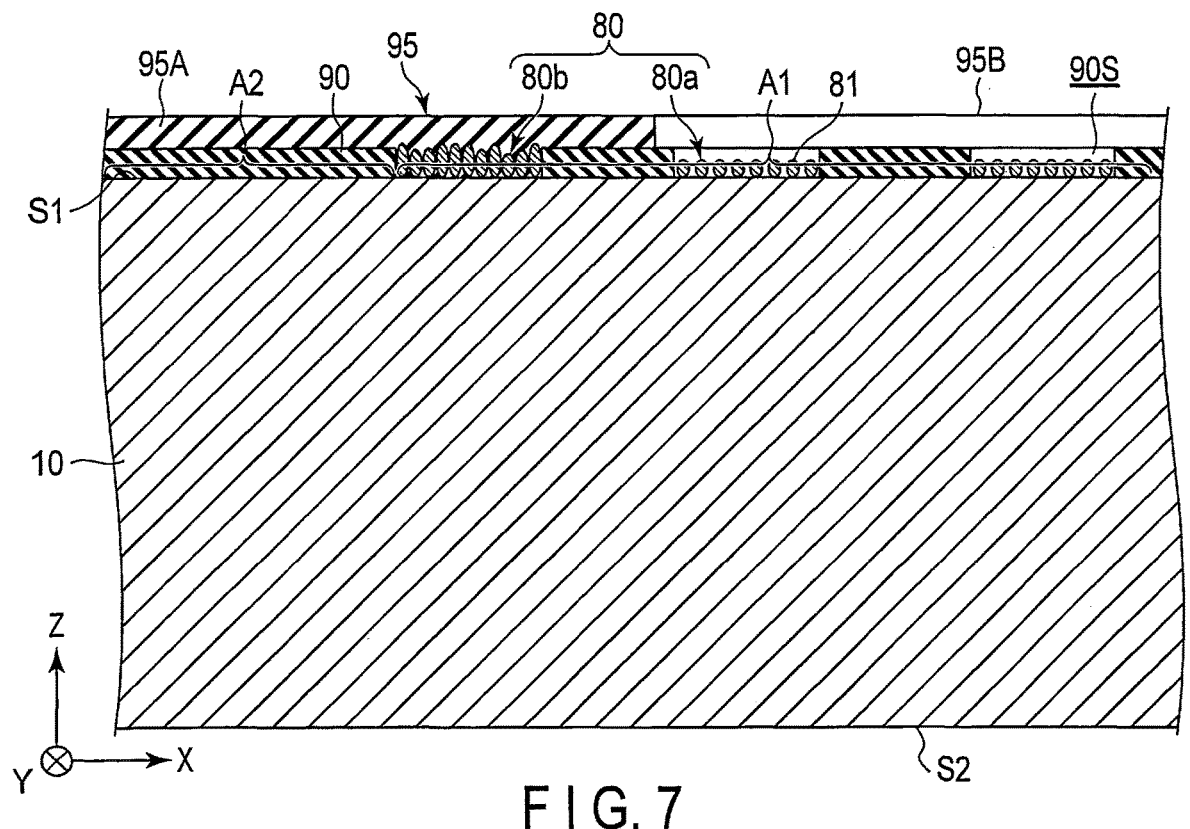
FIG. 7 is a cross-sectional view showing still another step of the capacitor manufacturing method according to the first embodiment.
Figure 8:
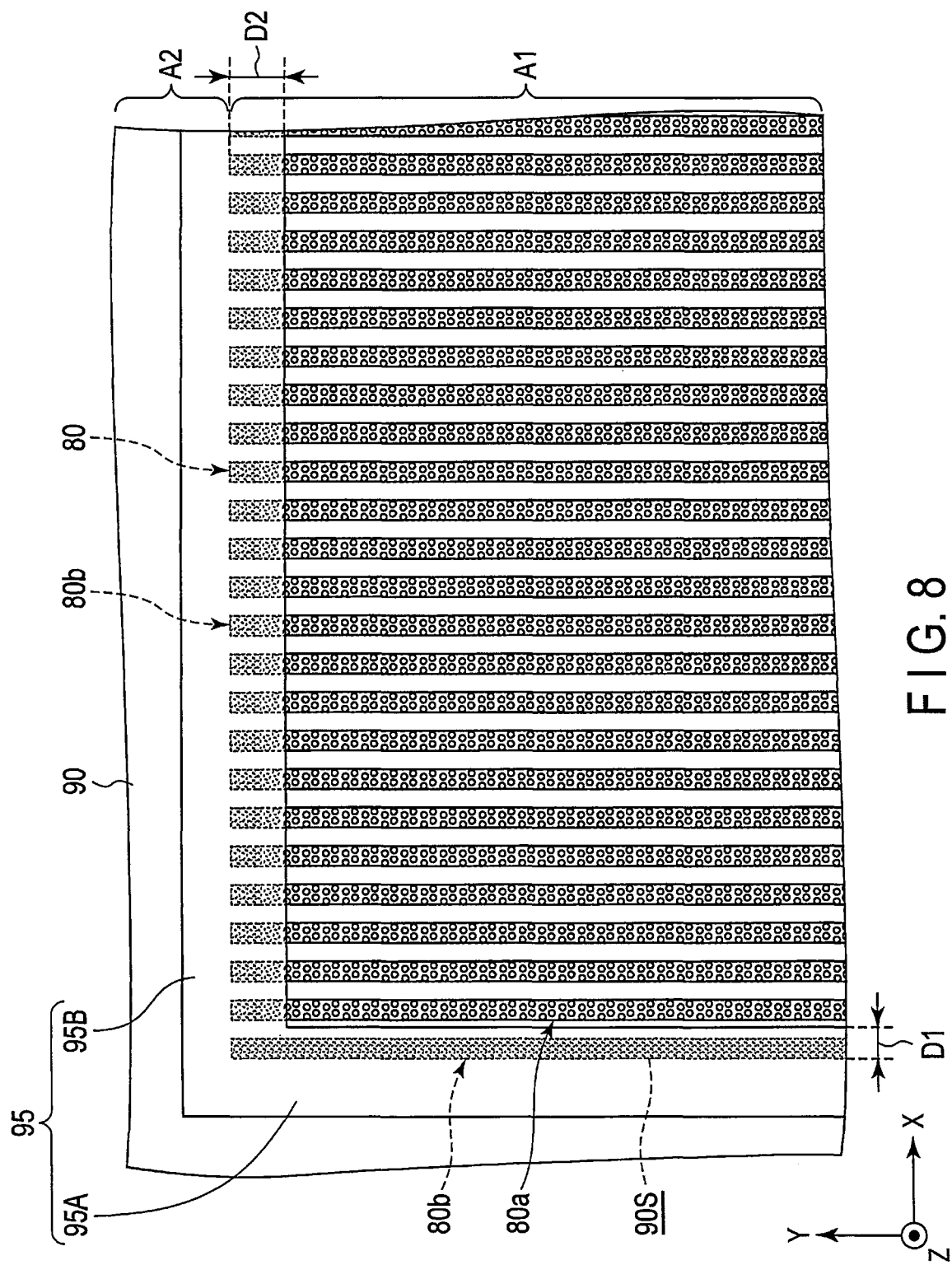
FIG. 8 is a top view showing a structure obtained by the step of FIG. 7.

Therefore, in this method, a second layer 95 is formed as shown in FIGS. 6 to 8. The second layer 95 includes a portion 95A extending in the length direction of the slits 90S and a portion 95B extending in a direction in which the slits 90S are arranged.

The second layer 95 is a second mask layer that prevents an etching agent 100, which will be described later, from reaching the second catalyst portion 80b. The second layer 95 is formed so as to cover a portion of the catalyst layer 80 that is adjacent to the boundary between the first region A1 and the second region A2, and to expose a portion of the catalyst layer 80 that is spaced apart from the boundary. Accordingly, the second layer 95 covers the second catalyst portion 80b, without covering at least a part of the first catalyst portion 80a.

The second layer 95 is formed so that widths of portions located on the first region A1, namely, widths D1 and D2 in FIG. 8, are preferably within a range of 20 μm to 100 μm, more preferably within a range of 20 μm to 50 μm. If the widths are increased, the whole second catalyst portion 80b can be reliably covered with the second layer 95. However, if the widths are increased, the area of the portion of the first catalyst portion 80a that is covered with the second layer 95 becomes larger.

The widths D1 and D2 may be equal to each other. Alternatively, the widths D1 and D2 may be different. For example, the width D1 may be greater than the width D2.

The second layer 95 is formed so that the thickness is preferably within a range of 0.1 μm to 10 μm, more preferably within a range of 0.5 μm to 1 μm. If the second layer 95 is thick, the whole second catalyst portion 80b can be reliably covered with the second layer 95. However, if the second layer 95 is thick, the costs will be increased.

Examples of the material of the second layer 95 include organic materials such as polyimide, fluororesin, phenol resin, acrylic resin, and novolac resin, and inorganic materials such as silicon oxide and silicon nitride.

The second layer 95 can be formed by, for example, existing semiconductor processes. The second layer 95 made of an organic material can be formed by, for example, photolithography. The second layer 95 made of an inorganic material can be formed by, for example, deposition of an inorganic material layer by vapor deposition, formation of a mask by photolithography, and patterning of the inorganic material layer by etching. The material of the second layer 95 is preferably an organic material.

As the second layer 95 is formed, the material of the second layer 95 may adhere to a portion of the first catalyst portion 80a that should not be covered with the second layer 95. Such an adhered material reduces the catalyst activity. Therefore, after the second layer 95 is formed, it is preferable to remove the adhered material from the exposed portion of the first catalyst portion 80a by, for example, etching. For example, if an organic material is used as the material of the second layer 95, it is preferable to perform ashing. If this treatment is performed on the structure shown in FIG. 6, the second layer 95 is thinned as shown in FIG. 7.

Next, the substrate 10 is etched with an assist from a noble metal as a catalyst to form the recesses on the first main surface S1.

Figure 9:
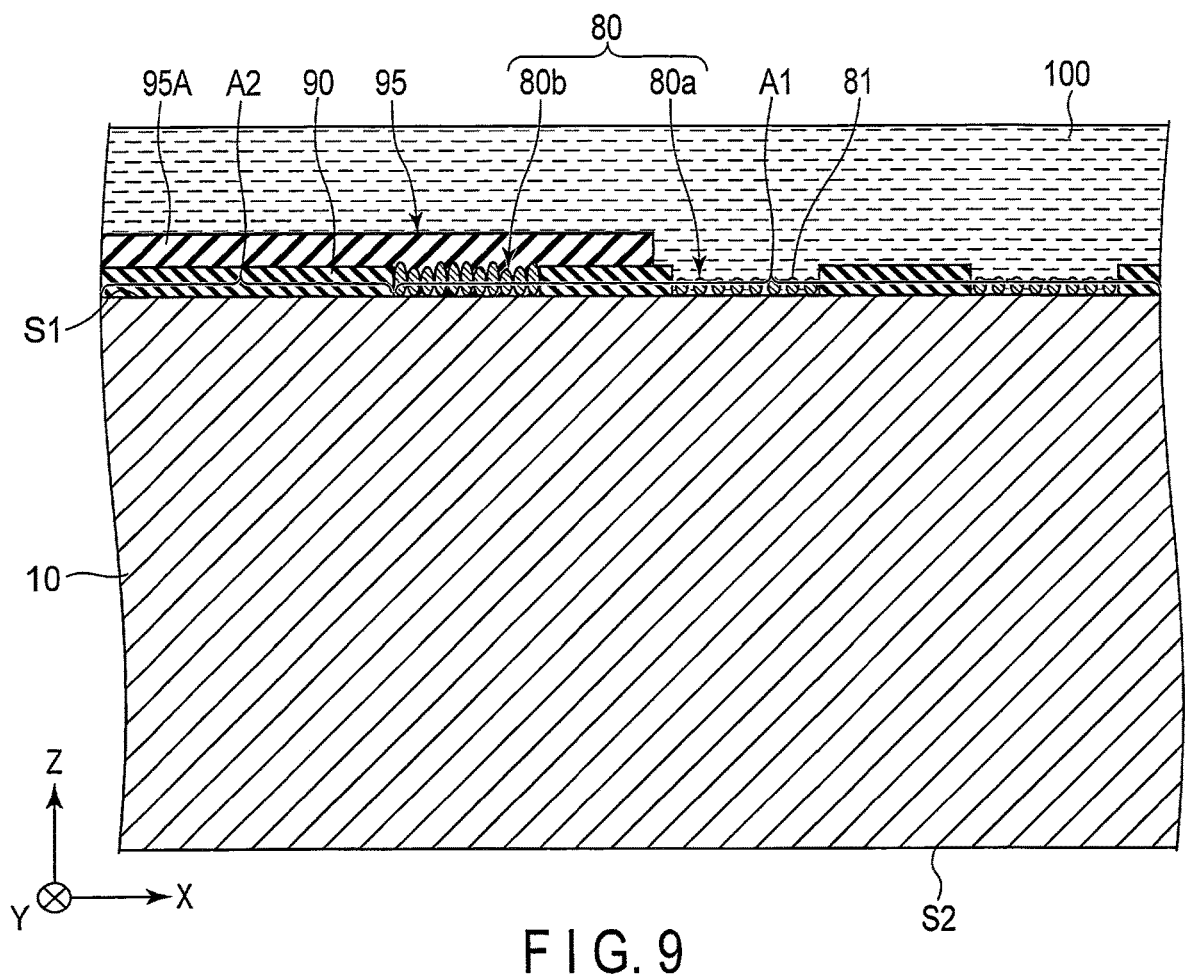
FIG. 9 is a cross-sectional view showing still another step of the capacitor manufacturing method according to the first embodiment.

Specifically, as shown in FIG. 9, the substrate 10 is etched with an etching agent 100. For example, the substrate 10 is immersed in the etching agent 100 in liquid form to bring the etching agent 100 into contact with the substrate 10.

The etching agent 100 contains an oxidizer and hydrogen fluoride.

The concentration of hydrogen fluoride in the etching agent 100 is preferably within a range of 1 mol/L to 20 mol/L, more preferably within a range of 5 mol/L to 10 mol/L, and further preferably within a range of 3 mol/L to 7 mol/L. When the hydrogen fluoride concentration is low, it is difficult to achieve a high etching rate. When the hydrogen fluoride concentration is high, excess side etching may occur.

The oxidizer can be selected from, for example, hydrogen peroxide, nitric acid, $AgNO_3$, $KAuCl_4$, $HAuCl_4$, $K_2PtCl_6$, $H_2PtCl_6$, $Fe(NO_3)_3$, $Ni(NO_3)_2$, $Mg(NO_3)_2$, $Na_2S_2O_8$, $K_2S_2O_8$, $KMnO_4$, and $K_2Cr_2O_7$. Hydrogen peroxide is favorable as the oxidizer because no harmful byproducts are produced, and a semiconductor element is not contaminated.

The concentration of the oxidizer in the etching agent 100 is preferably within a range of 0.2 mol/L to 8 mol/L, more preferably within a range of 2 mol/L to 4 mol/L, and further preferably within a range of 3 mol/L to 4 mol/L.

The etching agent 100 may further contain a buffer. The buffer contains, for example, at least one of ammonium fluoride and ammonia. As an example, the buffer is ammonium fluoride. As another example, the buffer is a mixture of ammonium fluoride and ammonia.

The etching agent 100 may further contain other components such as water.

When such an etching agent 100 is used, the material of the substrate 10, i.e. silicon in this embodiment, is oxidized in regions of the substrate 10 that are close to the catalyst particles 81 and that the etching agent 100 can reach. Then, oxide generated thereby is dissolved and removed by hydrofluoric acid. In contrast, in regions of the substrate 10 where the catalyst particles 81 are not present in the vicinity, the aforementioned reaction does not occur. Furthermore, in regions of the substrate 10 where the catalyst particles 81 are present in the vicinity, if the etching agent 100 cannot reach the regions due to the second layer 95, the aforementioned reaction does not occur. Therefore, only the portions that are close to the catalyst particles 81 and that the etching agent 100 can reach are selectively etched.

Figure 10:
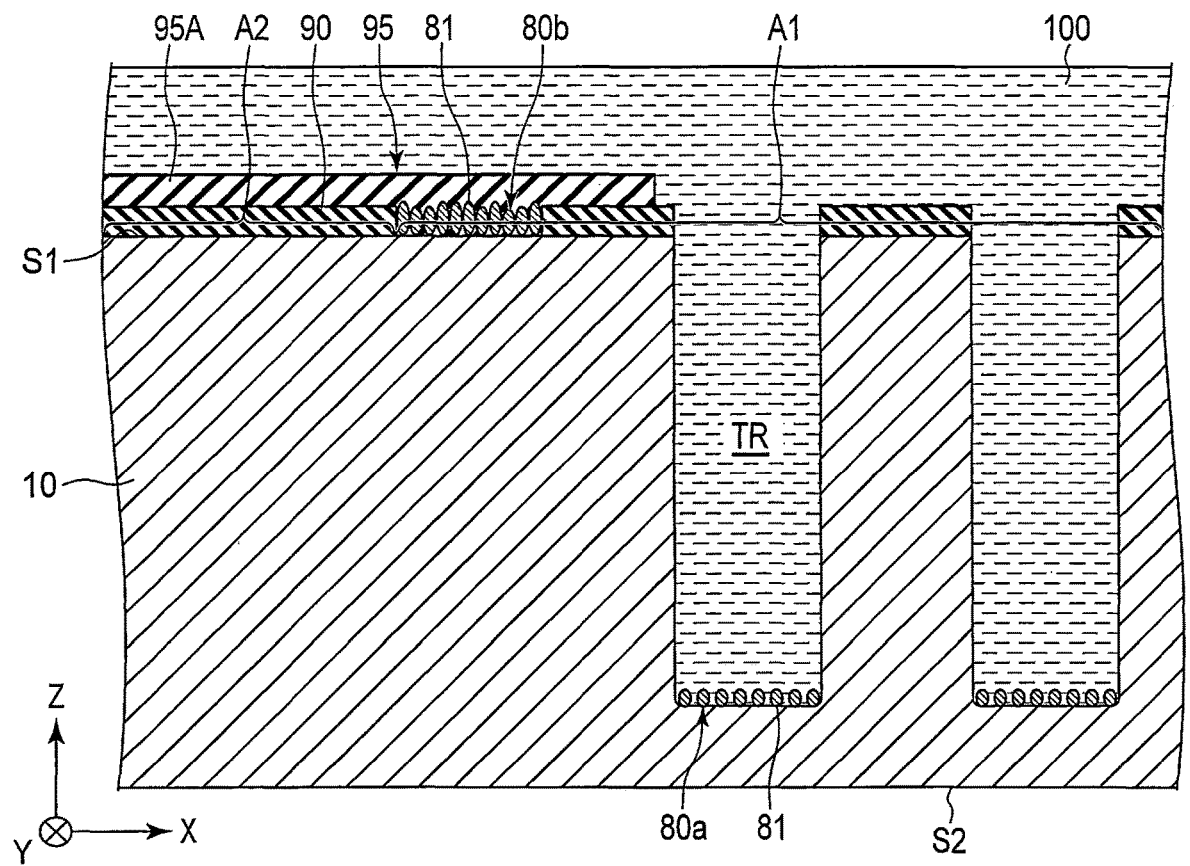
FIG. 10 is a cross-sectional view showing still another step of the capacitor manufacturing method according to the first embodiment.

The catalyst particles 81 move toward the second main surface S2 as the etching progresses, and etching similar to the above is performed there. As a result, as shown in FIG. 10, at the positions of portions of the first catalyst layer 80a that are not covered with the second layer 95, etching progresses from the first main surface S1 toward the second main surface S2 in a direction perpendicular to the first main surface S1.

Figure 11:
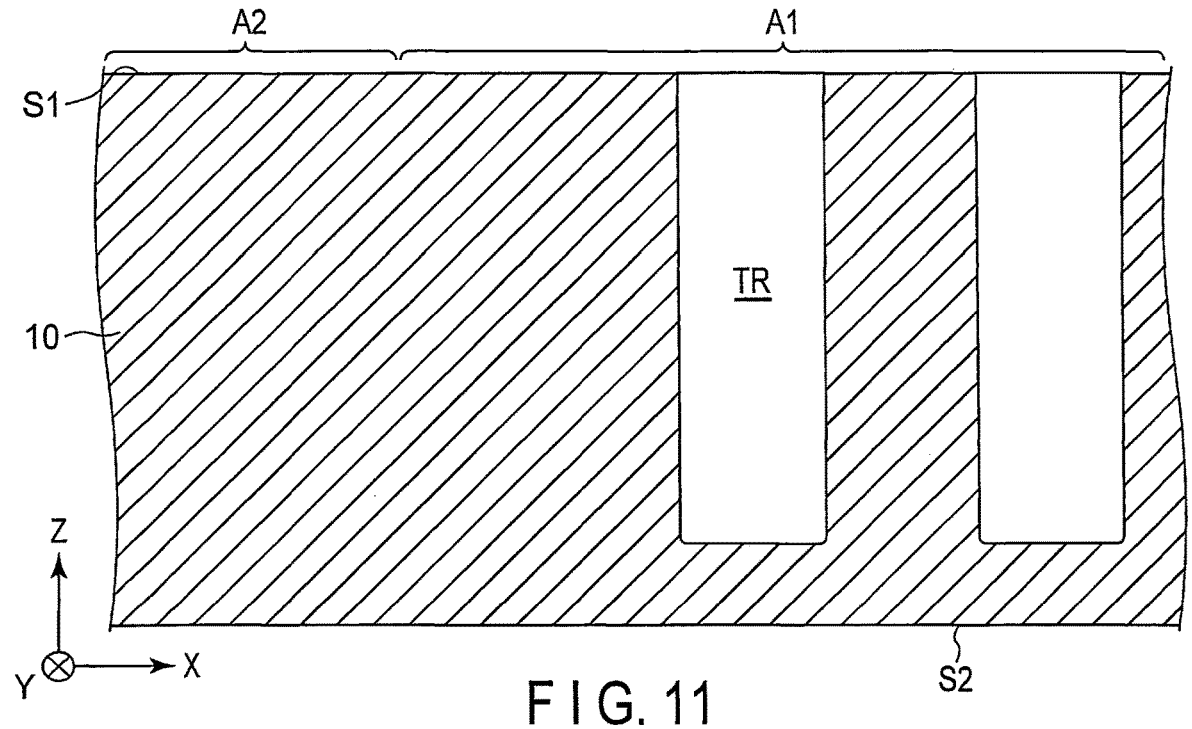
FIG. 11 is a cross-sectional view showing a structure obtained by the steps of FIGS. 9 and 10.

In this way, the recesses TR shown in FIG. 11 are formed on the first main surface S1.

Thereafter, the first layer 90, the second layer 95, and the catalyst layer 80 are removed from the substrate 10. The first layer 90 may be removed from the substrate 10 after the catalyst layer 80 is formed and before the second layer 95 is formed.

Next, the conductive layer 20a shown in FIG. 2 is formed on the substrate 10 to obtain the conductive substrate CS. As described above, the conductive layer 20a is the lower electrode of the capacitor. The conductive layer 20a can be formed by, for example, doping the surface region of the substrate 10 with impurities at a high concentration. The conductive layer 20a made of polysilicon can be formed by, for example, LPCVD (low pressure chemical vapor deposition). The conductive layer 20a made of metal can be formed by, for example, electrolytic plating, reduction plating, or displacement plating.

A plating solution is a liquid containing a salt of a metal to be plated. As the plating solution, a general plating solution, such as a copper sulfate plating solution containing copper sulfate pentahydrate and sulfuric acid, a copper pyrophosphate plating solution containing copper pyrophosphate and potassium pyrophosphate, and a nickel sulfamate plating solution containing nickel sulfamate and boron, can be used.

The conductive layer 20a is preferably formed by a plating method using a plating solution containing a salt of a metal to be plated, a surfactant, and carbon dioxide in a supercritical or subcritical state. In this plating method, the surfactant is interposed between particles made of supercritical carbon dioxide and a continuous phase of a solution containing a salt of a metal to be plated. That is, the surfactant is allowed to form micelles in the plating solution, and supercritical carbon dioxide is incorporated in these micelles.

In a normal plating method, the supply of the metal to be plated may be insufficient in the vicinity of the bottom portions of the recesses. This is particularly noticeable when a ratio D/W of the depth D to a width or diameter W of the recesses is large.

The micelles incorporating supercritical carbon dioxide can easily enter narrow gaps. As the micelles move, the solution containing the salt of the metal to be plated also moves. Therefore, according to a plating method using a plating solution containing a salt of a metal to be plated, a surfactant, and carbon dioxide in a supercritical or subcritical state, the conductive layer 20a having a uniform thickness can be easily formed.

As described above, here, as an example, the conductive layer 20a is formed by doping the surface region of the substrate 10 with impurities at a high concentration. In other words, the surface region of the substrate 10 on the first main surface S1 side is used as the conductive layer 20a.

Next, the dielectric layer 30 is formed on the conductive layer 20a. The dielectric layer 30 can be formed by, for example, CVD (chemical vapor deposition). Alternatively, the dielectric layer 30 can be formed by oxidizing, nitriding, or oxynitriding the surface of the conductive layer 20a.

Next, the conductive layer 20b is formed on the dielectric layer 30. As described above, the conductive layer 20b is an upper electrode of the capacitor. As the conductive layer 20b, for example, a conductive layer made of polysilicon or metal is formed. Such a conductive layer 20b can be formed by, for example, the same method as described above for the conductive layer 20a.

Next, an opening is formed in the dielectric layer 30. Here, a portion of the dielectric layer 30 that is located on the first main surface S1 is opened in a frame shape. This opening can be formed by, for example, formation of a mask by photolithography and patterning by etching.

Next, a metal layer is formed and patterned to obtain the first internal electrode 70a and the second internal electrode 70b. The first internal electrode 70a and the second internal electrode 70b can be formed by, for example, a combination of film formation by sputtering or plating, and photolithography.

Thereafter, the insulating layer 60 is formed. The insulating layer 60 is opened at the positions corresponding to a part of the first internal electrode 70a and a part of the second internal electrode 70b. The insulating layer 60 can be formed by, for example, a combination of film formation by CVD and photolithography.

Next, the first external electrode 70c and the second external electrode 70d are formed on the insulating layer 60. Specifically, first, the first metal layers 70c1 and 70d1 are formed. Next, the second metal layers 70c2 and 70d2 are formed. The first metal layers 70c1 and 70d1 and the second metal layers 70c2 and 70d2 can be formed by, for example, a combination of film formation by sputtering or plating, and photolithography.

Thereafter, the structure thus obtained is diced. In the manner described above, the capacitor 1 shown in FIGS. 1 and 2 is obtained.

In this capacitor 1, the recesses TR are provided on the first main surface S1, and the stacked structure including the dielectric layer 30 and the conductive layer 20b is provided not only on the first main surface S1 but also in the recesses TR. Therefore, this capacitor 1 can achieve a large electric capacitance.

In the method described above, a process defect in etching with a catalyst is less prone to occur. This effect will be described below.

As described above with reference to FIGS. 4 and 5, in the region in the vicinity of the boundary between the first region A1 and the second region A2, the metal deposits in the slits 90S more easily as compared to the region sufficiently spaced apart from the boundary. As a result, the catalyst layer 80 includes a first catalyst portion 80a in which the noble metal deposits at a proper density and a second catalyst portion 80b in which the noble metal deposits at a high density.

This is because a region in the vicinity of the boundary between the first region A1 and the second region A2 differs from a region sufficiently spaced apart from the boundary in a balance between supply of a metal from a plating solution and consumption of the metal due to its deposition. More specifically, this is because no slit 90S is provided in the first layer 90 at a position corresponding to the second region A2 and therefore, the area of a region to which the plating solution in the vicinity of the boundary between the first region A1 and the second region A2 should supply the metal is smaller than the area of a region to which the plating solution sufficiently spaced apart from the boundary should supply the metal.

If the etching described above with reference to FIGS. 9 and 10 is performed without forming the second layer 95, the etching progresses in a direction perpendicular to the first main surface S1 in a region in which the first catalyst portion 80a is formed. In this case, however, process defects occur in a region in which the second catalyst portion 80b is formed; for example, the etching progresses in a direction inclined with respect to the first main surface S1, the direction of progress of etching varies, or the etching in the direction perpendicular to the first main surface S1 is not effectively performed. As a result, for example, a structure shown in FIG. 12 is obtained.

If the second layer 95 is formed, the etching agent 100 is prevented from being supplied to the second catalyst portion 80b. Therefore, the etching does not progress at the position corresponding to the second layer 95 and the aforementioned process defects do not occur. Accordingly, for example, a structure shown in FIG. 13 is obtained.

Second Embodiment

An etching method according to the second embodiment comprises forming a mask layer on a substrate, the substrate containing a semiconductor material and having a main surface, the main surface including a first region and a second region adjacent to each other, the mask layer including a first portion and a second portion, the first portion covering the first region and being provided with a plurality of openings or one or more openings defining a plurality of island-shaped portions, the second portion being a continuous layer covering the second region, and a height of the second portion at a position adjacent to a boundary between the first region and the second region with reference to the main surfaces being higher than a height of the first portion with reference to the main surfaces; forming a catalyst layer containing a noble metal on a portion(s) of the main surfaces exposed in the plurality of openings or the one or more openings by a plating method; and etching the substrate with an etching agent containing an oxidizer and hydrogen fluoride in a presence of the catalyst layer and the mask layer.

A method for manufacturing a structural body according to the second embodiment, comprises forming one or more recesses on the substrate by the above etching method.

A method for manufacturing a semiconductor device according to the second embodiment, comprises forming one or more recesses on the substrate by the above etching method; forming a lower electrode on side walls of the one or more recesses; forming a dielectric layer on the lower electrode; and forming an upper electrode on the dielectric layer.

A method for manufacturing a structural body, specifically a capacitor, which is an example of a semiconductor device, utilizing the above etching method is described below.

According to the method of the second embodiment, for example, the capacitor 1 described in the first embodiment can be manufactured. In the second embodiment, the capacitor 1 is manufactured by the following method.

Figure 14:
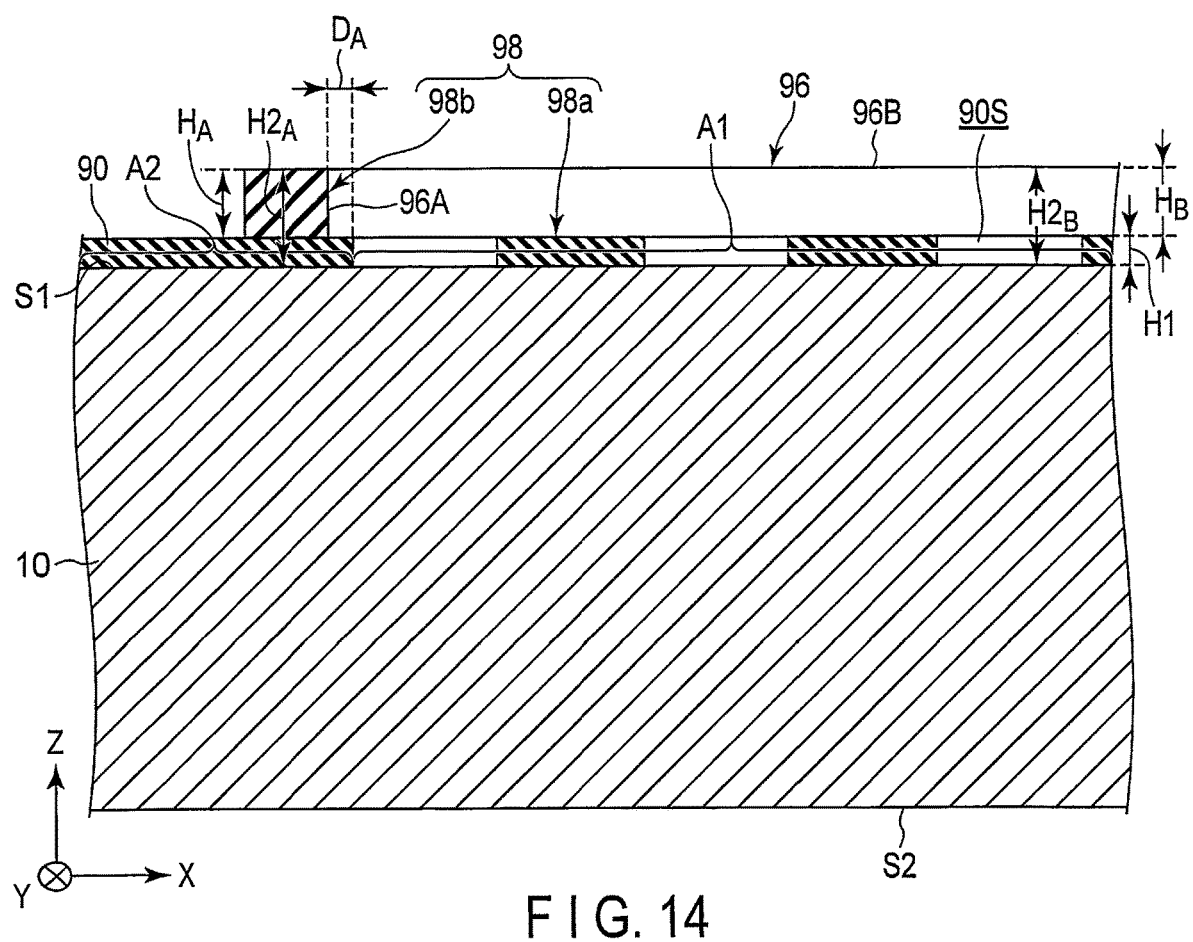
FIG. 14 is a cross-sectional view showing a step of a capacitor manufacturing method according to a second embodiment.

First, as shown in FIG. 14, a mask layer 98 is formed on a first main surface S1 of a substrate 10. The substrate 10 is the same as that of the first embodiment described above.

The mask layer 98 includes a first portion 98a and a second portion 98b.

The first portion 98a is a portion of the mask layer 98 that covers a first region A1. The first portion 98a is provided with a plurality of openings. Here, the openings are a plurality of slits 90S arranged in the width direction. The slits 90S have a length direction parallel to the Y direction, and are arranged in the X direction.

The openings in the first portion 98a may have a form other than the slit. For example, as the openings, the first portion 98a may include a plurality of though holes each opened in a circular, elliptical, or polygonal shape and arranged in two directions intersecting each other.

Alternatively, the first portion 98a may be provided with one or more openings that define a plurality of island-shaped portions, instead of a plurality of openings. In this case, pillar-shaped projections can be generated at the positions corresponding to the island-shaped portions by etching, which will be described later.

The second portion 98b is a portion of the mask layer 98 that covers the second region A2. The second portion 98b is a continuous film. Height H2A or H2B of the second portion 98b at a position adjacent to the boundary between the first region A1 and the second region A2 with reference to the first main surface S1 is greater than a height H1 of the first portion 98a with reference to the first main surface S1.

Figure 15:
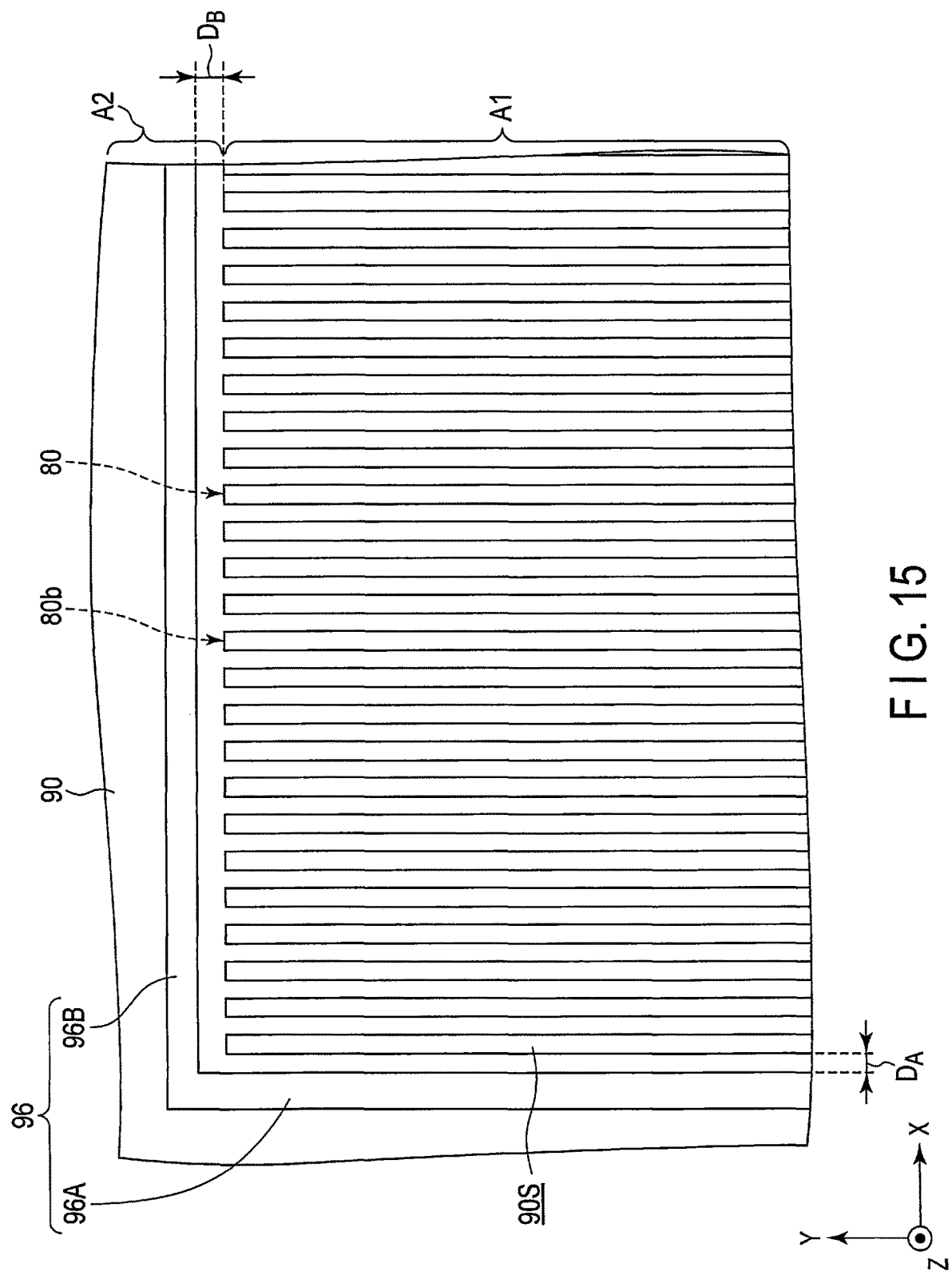
FIG. 15 is a top view showing a structure obtained by the step of FIG. 14.

The mask layer 98 is a stacked body of the first layer 90 and the second layer 96 shown in FIGS. 14 and 15. The first portion 98a is a portion that covers the first region A1 of the first layer 90. The second portion 98b is a combination of the second layer 96 and a portion of the first layer 90 that covers the second region A2.

The first layer 90 is formed on the first main surface S1. The first layer 90 is the same as that of the first embodiment described above. In other words, the first layer 90 serves the same function as that of the first embodiment described above.

The first layer 90 covers the first region A1 and the second region A2.

In a portion of the first layer 90 that cover the first region A1, a plurality of openings are provided. Here, the openings are a plurality of slits 90S arranged in the width direction. The slits 90S have a length direction parallel to the Y direction, and are arranged in the X direction.

The openings in the first layer 90 may have a form other than the slit. For example, as the openings, the first layer 90 may include a plurality of through holes each opened in a circular, elliptical, or polygonal shape and arranged in two directions intersecting each other. Alternatively, the first layer 90 may be provided with one or more openings that define a plurality of island-shaped portions, instead of a plurality of openings.

The portion of the first layer 90 that covers the second region A2 is a continuous film. The portion of the first layer 90 that covers the second region A2 is equal in height to the portion of the first layer 90 that covers the first region A1.

As a material of the first layer 90, for example, those described in the first embodiment can be used. The first layer 90 can be formed by, for example, the same method as in the first embodiment described above.

The second layer 96 is formed on the first layer 90. The second layer 96 exposes the portion of the first layer 90 that covers the first region A1. The second layer 96 covers the second region A2 of the first layer 90 at least at the position adjacent to the boundary between the first region A1 and the second region A2. Here, the second layer 96 has a frame shape surrounding the first region A1.

As a material of the second layer 96, for example, those described above for the second layer 95 in the first embodiment can be used. The second layer 96 can be formed by, for example, the same method as described above for the second layer 95 in the first embodiment.

As will be described layer, in the plating treatment for forming the catalyst layer 80, the second layer 96 prevents the metal from being excessively supplied from the plating solution to the first main surface S1 in the region in the vicinity of the boundary between the first region A1 and the second region A2. Accordingly, the density of the catalyst metal can be substantially equal in both the slit 90S in the vicinity of the boundary between the first region A1 and the second region A2 and the slit 90S sufficiently spaced apart from the boundary.

The mask layer 98 may be formed integrally. For example, first, a photosensitive resin layer is formed on the first layer 90. As the photosensitive resin, for example, a positive-type photoresist is used. Next, exposure using, for example, a grating mask is performed, or exposure is performed twice or more, on the photosensitive resin layer. As a result, first and second exposure portions, which are different in the exposure amount, and a non-exposure portion are formed in the photosensitive resin layer. Then, development or the like is performed, so that an integrally formed mask layer 98 is obtained.

The ratio of the height H2A or H2B of the second portion 98$b$ at a position adjacent to the boundary with reference to the first main surface S1 to the height H1 of the first portion 98$a$ with reference to the first main surface S1 is preferably within a range of 2 to 5, and more preferably, within a range of 2 to 3.

Here, the height H1 is the thickness of the first layer 90. The height H2A is a height of the second portion 98$b$ with reference to the first main surface S1 at a position adjacent to a portion of the boundary that extends along the length direction of the slit 90S. In other words, the height H2A is a height of the portion 96A of the second layer 96 that extends in the length direction of the slit 90S with reference to the first main surface S1. The height H2B is a height of the second portion 98$b$ with reference to the first main surface S1 at the position adjacent to a portion of the boundary that extends along the direction of arrangement of the slits 90S. In other words, the height H2B is a height of the portion 96B of the second layer 96 that extends in the direction of arrangement of the slits 90S with reference to the first main surface S1.

The ratio of a height HA or HB of the second portion 98$b$ with reference to the first portion 98$a$ to a distance DA or DB in a direction parallel to the first main surface S1 from a highest portion of the second portion 98$b$ with reference to the first main surface S1 to the plurality of openings or one or more openings is preferably within a range of 1 to 4, and more preferably within a range of 2 to 4.

Here, the distance DA is a distance in the direction of arrangement of the slits 90S from the portion 96A of the second layer 96 that extends in the length direction of the slits 90S to the slits 90S. The distance DB is a distance in the length direction of the slits 90S from the portion 96B of the second layer 96 that extends in the direction of arrangement of the slits 90S to the slits 90S.

Here, the height HA is a height of the second portion 98$b$ with reference to the first portion 98$a$ at the position adjacent to a portion of the boundary that extends along the length direction the slits 90S. In other words, the height HA is a thickness of a portion of the second layer 96 that extends in the length direction of the slits 90S. The height HB is a height of the second portion 98$b$ with reference to the first portion 98$a$ at the position adjacent to a portion of the boundary that extends along the direction of arrangement of the slits 90S. In other words, the height HB is a thickness of a portion of the second layer 96 that extends in the direction of arrangement of the slits 90S.

When the ratios mentioned above are increased, the amount of supply of the metal from the plating solution to the first main surface S1 is reduced in a region in the vicinity of the boundary between the first region A1 and the second region A2 in the plating treatment for forming the catalyst layer 80.

The height H1 is preferably within a range of 0.1 µm to 10 µm, and more preferably within a range of 0.5 µm to 1 µm.

The heights H2A and H2B are preferably within a range of 0.2 µm to 20 µm, and more preferably within a range of 1 µm to 3 µm. The heights H2A and H2B may be equal to each other or different from each other.

The heights HA and HB are preferably within a range of 0.1 µm to 10 µm, and more preferably within a range of 0.5 µm to 2 µm. The heights HA and HB may be equal to each other or different from each other.

The distances DA and DB are preferably within a range of 0.05 µm to 0.5 µm, and more preferably within a range of 0.1 µm to 0.2 µm. The distances DA and DB may be equal to each other or different from each other.

After the mask layer 98 is formed as described above, the catalyst layer 80 is formed on portions of the first main surface S1 that are exposed in the slits 90S, as shown in FIG. 16. As a material of the catalyst layer 80, for example, those described above in the first embodiment can be used. The catalyst layer 80 can be formed by, for example, the same method as in the first embodiment described above.

Next, as shown in FIG. 17, the substrate 10 is etched with the etching agent 100 containing an oxidizer and hydrogen fluoride in a presence of the catalyst layer 80 and the mask layer 98. Accordingly, the recesses TR are formed on the first main surface S1.

As the etching agent 100, for example, those described above in the first embodiment can be used. The etching is performed by, for example, the same method as in the first embodiment described above.

Next, the mask layer 98 and the catalyst layer 80 are removed from the substrate 10. Thereafter, the conductive layer 20a, the dielectric layer 30, and the conductive layer 20b are formed as in the first embodiment described above. Furthermore, as in the first embodiment described above, the first internal electrode 70a, the second internal electrode 70b, the insulating layer 60, the first external electrode 70c, and the second external electrode 70d are formed, and dicing is performed. In the manner described above, the capacitor 1 shown in FIGS. 1 and 2 is obtained.

In this capacitor 1, the recesses TR are provided on the first main surface S1, and the stacked structure including the dielectric layer 30 and the conductive layer 20b is provided not only on the first main surface S1 but also in the recesses TR. Therefore, this capacitor 1 can achieve a large electric capacitance.

In this method, as described above, in the plating treatment for forming the catalyst layer 80, the second layer 96 prevents the metal from being excessively supplied from the plating solution to the first main surface S1 in the region in the vicinity of the boundary between the first region A1 and the second region A2. Accordingly, the density of the catalyst metal can be substantially equal in both the slit 90S in the vicinity of the boundary between the first region A1 and the second region A2 and the slit 90S sufficiently spaced apart from the boundary. Therefore, similarly to the first embodiment, a process defect in etching with a catalyst is less prone to occur.

Various modifications can be made to the methods of the first and second embodiments.

Explanations have been given for the capacitor as an example of the structural body in the first and second embodiments; however, the techniques described above can be applied to another structural body.

In the method of the first and second embodiments described above, the height of the portion of the first region A1 that corresponds to the slits 90S may be made higher than the height of the remainder portion of the first region A1, prior to forming the catalyst layer 80. For example, the height of a portion of the first region A1 that is covered with the first layer 90 may be reduced by etching. Alternatively, the height of a portion of the first region A1 that corresponds to the slits 90S may be increased by epitaxial growth. In this way, the direction of progress of etching is not easily varied.

In the method of the second embodiment described above, the second layer 96 is formed along the whole of the boundary between the first region A1 and the second region A2. The portion 96B of the second layer 96 that extends in the direction of arrangement of the slits 90S may be formed only in the vicinity of the portion 96A of the second layer 96 that extends in the length direction of the slits 90S, as shown in FIG. 18.

If the recesses TR are trenches, projections interposed between the adjacent recesses TR are shaped like a partition wall. In this case, in etching for forming the recesses TR, if a process defect occurs in the whole length of a certain recess TR, the projection adjacent to the recess TR may break. On the other hand, in etching for forming the recesses TR, if a process defect occurs only at the end portions of a certain recess TR, the projection adjacent to the recess TR is less prone to break.

Figure 18:
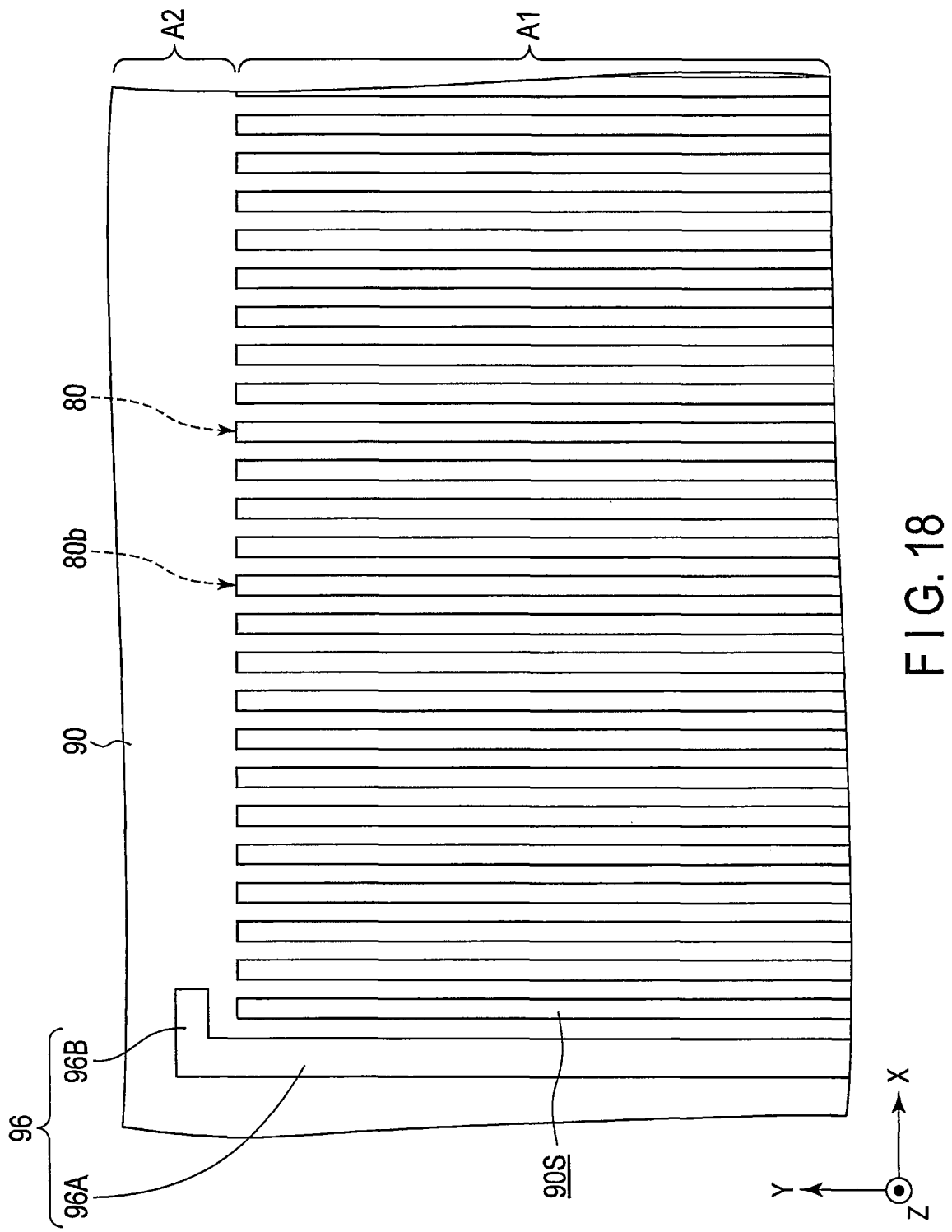
FIG. 18 is a cross-sectional view showing a modified example of the capacitor manufacturing method according to the second embodiment.

Therefore, also in the case where the structure shown in FIG. 18 is adopted, the projection between the adjacent recesses TR is less prone to break in the etching for forming the recesses TR.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An etching method comprising:
    forming a first layer on a substrate, the substrate containing a semiconductor material and having a main surface, the main surface including a first region and a second region adjacent to each other, the first layer covering the first region and the second region, a portion of the first layer covering the first region being provided with a plurality of openings or one or more openings defining a plurality of island-shaped portions, and a portion of the first layer covering the second region being a continuous layer;
    forming a catalyst layer containing a noble metal on a portion(s) of the main surface exposed in the plurality of openings or the one or more openings by a plating method;
    forming a second layer to cover a portion of the catalyst layer adjacent to a boundary between the first region and the second region and expose a portion of the catalyst layer spaced apart from the boundary; and
    etching the substrate with an etching agent containing an oxidizer and hydrogen fluoride in a presence of the catalyst layer and the second layer.

2. The etching method according to claim 1, wherein the first layer is provided with a plurality of slits arranged in a width direction as the plurality of openings.

3. The etching method according to claim 1, wherein the substrate is etched in a presence of the first layer in addition to the catalyst layer and the second layer.

4. The etching method according to claim 1, wherein the second layer is formed such that a width of a portion thereof located on the first region is within a range of 20 μm to 100 μm.

5. The etching method according to claim 1, wherein a particulate layer formed of particles containing the noble metal is formed as the catalyst layer.

6. A method for manufacturing a structural body, comprising forming one or more recesses on the substrate by the etching method according to claim 1.

7. A method for manufacturing a semiconductor device, comprising:
    forming one or more recesses on the substrate by the etching method according to claim 1;
    forming a lower electrode on side walls of the one or more recesses;
    forming a dielectric layer on the lower electrode; and
    forming an upper electrode on the dielectric layer.

8. An etching method comprising:
forming a mask layer on a substrate, the substrate containing a semiconductor material and having a main surface, the main surface including a first region and a second region adjacent to each other, the mask layer including a first portion and a second portion, the first portion covering the first region and being provided with a plurality of openings or one or more openings defining a plurality of island-shaped portions, the second portion being a continuous layer covering the second region, and a height of the second portion at a position adjacent to a boundary between the first region and the second region with reference to the main surface being higher than a height of the first portion with reference to the main surface;
forming a catalyst layer containing a noble metal on a portion(s) of the main surface exposed in the plurality of openings or the one or more openings by a plating method; and
etching the substrate with an etching agent containing an oxidizer and hydrogen fluoride in a presence of the catalyst layer and the mask layer.

9. The etching method according to claim 8, wherein the mask layer is provided with a plurality of slits arranged in a width direction as the plurality of openings.

10. The etching method according to claim 8, wherein the forming the mask layer includes:
forming a first layer on the substrate, the first layer covering the first region and the second region, a portion of the first layer covering the first region being provided with the plurality of openings or one or more openings that define the plurality of island-shaped portions, and a portion of the first layer covering the second region being a continuous layer; and
forming a second layer such that the portion of the first layer covering the first region is exposed and the second layer covers the second region of the first layer at least at a position adjacent to the boundary.

11. The etching method according to claim 8, wherein a ratio of the height of the second portion at the position adjacent to the boundary with reference to the main surface to the height of the first portion with reference to the main surface is within a range of 2 to 5.

12. The etching method according to claim 8, wherein a ratio of a height of the second portion with reference to the first portion to a distance in a direction parallel to the main surface from a highest portion of the second portion with reference to the main surface to the plurality of openings or one or more openings is within a range of 1 to 4.

13. The etching method according to claim 8, wherein a particulate layer formed of particles containing the noble metal is formed as the catalyst layer.

14. A method for manufacturing a structural body, comprising forming one or more recesses on the substrate by the etching method according to claim 8.

15. A method for manufacturing a semiconductor device, comprising:
forming one or more recesses on the substrate by the etching method according to claim 8;
forming a lower electrode on side walls of the one or more recesses;
forming a dielectric layer on the lower electrode; and
forming an upper electrode on the dielectric layer.

* * * * *